(12) United States Patent
Zhao et al.

(10) Patent No.: US 12,712,021 B2
(45) Date of Patent: Aug. 18, 2026

(54) WORD LINE SWITCH GATE VOLTAGE AND WELL VOLTAGE SEPARATION

(71) Applicant: Sandisk Technologies, Inc., Milpitas, CA (US)

(72) Inventors: Qinghua Zhao, San Carlos, CA (US); Gwang Yeong Stanley Jeong, Dublin, CA (US); Sichang Qin, San Jose, CA (US); Sudarshan Narayanan, San Jose, CA (US); Mohan Vamsi Dunga, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 200 days.

(21) Appl. No.: 18/391,560

(22) Filed: Dec. 20, 2023

(65) Prior Publication Data

US 2025/0210108 A1 Jun. 26, 2025

(51) Int. Cl.
*G11C 16/04* (2006.01)
*G11C 16/08* (2006.01)

(52) U.S. Cl.
CPC ...... *G11C 16/0433* (2013.01); *G11C 16/0483* (2013.01); *G11C 16/08* (2013.01)

(58) Field of Classification Search
CPC . G11C 16/0433; G11C 16/0483; G11C 16/08; G11C 16/10
See application file for complete search history.

(56) References Cited

U.S. PATENT DOCUMENTS

| | | | | |
|---|---|---|---|---|
| 8,737,137 B1 | 5/2014 | Choy et al. | | |
| 8,917,554 B2 | 12/2014 | Toyama et al. | | |
| 9,142,305 B2 | 9/2015 | Dunga et al. | | |
| 9,368,210 B2 | 6/2016 | Maejima et al. | | |
| 9,368,213 B2 | 6/2016 | Fukano | | |
| 9,659,662 B2 | 5/2017 | Nam et al. | | |
| 11,404,123 B1 * | 8/2022 | Shao | ...................... | H10B 41/41 |
| 2003/0198101 A1 * | 10/2003 | Pio | ........................ | G11C 16/08 365/200 |
| 2007/0014152 A1 | 1/2007 | Shibata et al. | | |
| 2011/0096602 A1 | 4/2011 | Kim et al. | | |
| 2021/0287747 A1 * | 9/2021 | Passerini | ................ | G11C 16/30 |

OTHER PUBLICATIONS

J. Zhang, L. Fang, J. Chen, S. Hou and X. Tong, "Single Event Transient Study of pMOS Transistors in 65 nm Technology With and Without a Deep n+ Well Under Particle Striking," in IEEE Access, vol. 7, pp. 149255-149261, 2019 (Year: 2019).*

* cited by examiner

*Primary Examiner* — Alexander Sofocleous
*Assistant Examiner* — James S. Wells
(74) *Attorney, Agent, or Firm* — Pearl Cohen LLP

(57) ABSTRACT

Technology for operating word line switch transistors in a memory system. A memory system provides for separate control of the voltage to the gates of the word line switch transistors and a voltage to a well in which the word line switch transistors reside. This allows for a negative voltage to be applied to the gates and/or the well. However, if desired, a non-negative voltage (e.g., 0V) may be applied to the gates or the well.

16 Claims, 19 Drawing Sheets

Storage System 100
Memory Controller 120
130
Storage
160
Memory Interface
158
ECC Engine
156
Processor
154
NOC
164
Local Memory Controller
140
local memory
152
Host Interface
102
Host 800
Substrate 514
P-well 810
820
P-well 510
520a
Control Signal A
Negative Voltage Source
706
Switch A
Transfer Circuitry
704
to gates
WL switches
702
To WLs
Control Signal B
Non-negative Voltage
708
Switch B
832
520b
Control Circuit
714
Control Signals A, B

Figure 9:
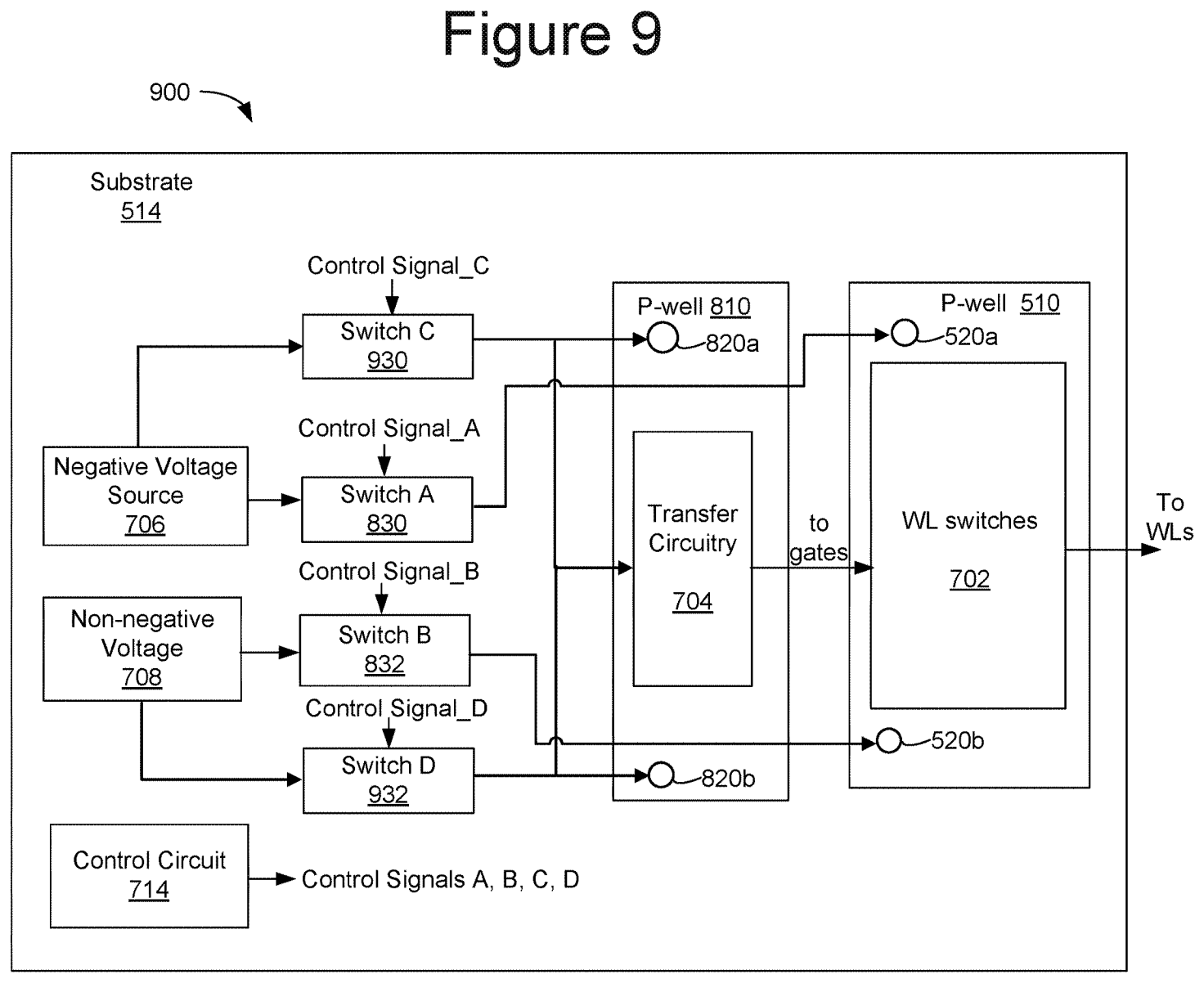

Substrate
514

Negative Voltage
Source
706

Non-negative
Voltage
708

Control Circuit
714

Control Signals A, B, C, D

Control Signal_C

Switch C
930

Control Signal_A

Switch A
830

Control Signal_B

Switch B
832

Control Signal_D

Switch D
932

P-well 810
820a
820b

Transfer
Circuitry
704 to
gates

P-well 510
520a
520b

WL switches
702

To
WLs 1000
1010
1002
Vgate
1018
OFF
BLK_unsel
OFF
1016
VRD
1020
C
1010
VRD
VSS
B
1014
VSS
1006
ON
A
1004
OFF
VRD
D
VSS
1012
1010
712
710
708
706

1100
1110
1002
BLK_unsel
Vgate
1018
OFF
OFF
1016
VRD
C
1020
1112
VRD
ON
830
832
B
VSS
VSS
1014
1006
ON
1004
OFF
A
D
VRD
VSS
1012
1112
706
708

WORD LINE SWITCH GATE VOLTAGE AND WELL VOLTAGE SEPARATION

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

A memory structure in the memory system typically contains many memory cells and various control lines. The memory structure may be three-dimensional (3D). One type of 3D structure has non-volatile memory cells arranged as vertical NAND strings. The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. The drain side select gate typically has one or more transistors in series. Likewise, the source side select gate typically has one or more transistors in series. Each NAND string is associated with a bit line. The block typically has many word lines that provide voltages to control gates of the memory cell transistors. For a 3D architecture, each word line resides at a different layer of the block. Therefore, each word line (WL) may connect to the control gate of one memory cell on each NAND string in the block.

One type of three-dimensional NAND memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with materials including a charge-trapping material to create a vertical column of memory cells (e.g., NAND string). The conductive layers may serve as word lines or select lines.

Operating such 3D memory structures includes applying voltages to the word lines. The memory system has word line switch transistors that provide the operating voltages to the word lines. In a typical NAND architecture, there is a separate set of word line switch transistors associated with each block. In a typical NAND architecture, one block in a plane is selected for a memory operation (e.g., read, program, erase) while all other blocks in the plane are unselected. Voltage generators are used to provide word line operating voltages to the word line switch transistors. The voltage to the gates of the word line switch transistors needs to be controlled to either pass the word line operating voltages to the word lines in the selected block or prevent the word line operating voltages from passing to the unselected blocks. In some architectures a large number of the word line switch transistors reside in a well, such as a P-well. For example, all of the word line switch transistors for a plane may reside within the same P-well.

The number of word lines in a block can be increased to allow for more data to be stored in a block. However, this requires additional word line switch transistors. Therefore, the area taken up by the word line switch transistors becomes an increasing factor in the size and cost of semiconductor chips that contain the word line switch transistors.

BRIEF DESCRIPTION OF THE DRAWINGS

Like-numbered elements refer to common components in the different figures.

FIG. 9 is a block diagram of still another embodiment of an apparatus for controlling the voltages to word line switches.

DETAILED DESCRIPTION

Technology is disclosed for operating word line switch transistors in a memory system. Embodiments of a memory system provide for separate control of the voltage to the gates of the word line switch transistors and voltage to a well in which the word line switch transistors reside. This allows for a negative voltage to be applied to the gates and/or the well. However, if desired, a non-negative voltage (e.g., 0V) may be applied to the gates or the well. The negative voltages help to reduce current consumption by, for example, reducing leakage current in WL switch transistors associated with unselected blocks. Reducing the leakage current allows the WL switch transistors to be made smaller, thereby saving chip area and cost. Moreover, circuitry used to provide the flexibility in voltage assignments to the gates and the well occupies very little area. Furthermore, in an embodiment, both the word line switch transistors and the circuitry used to provide the voltage to the gates of the word line switch transistors reside in the same well thereby saving area.

Figure 1:
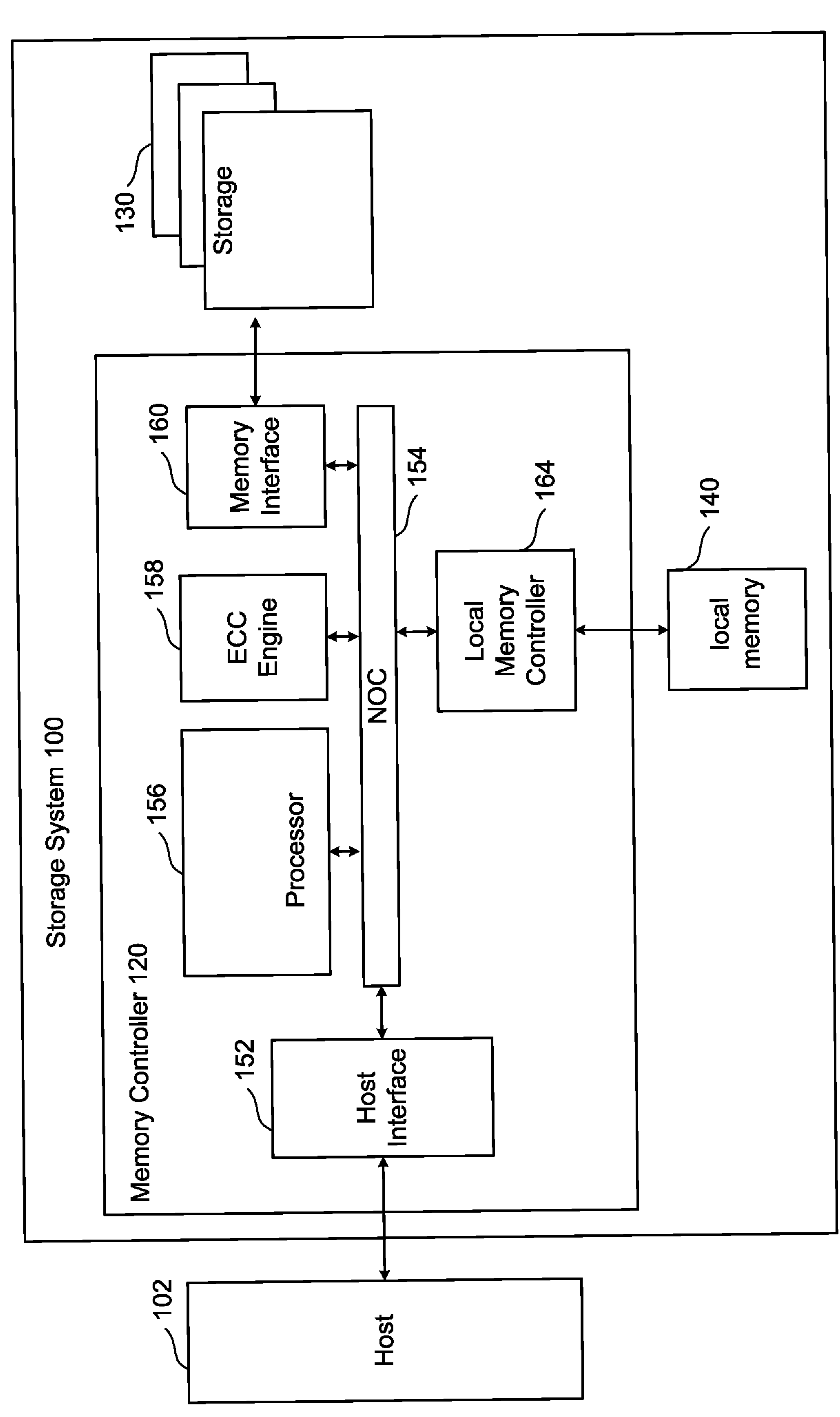
FIG. 1 is a block diagram of one embodiment of a storage system that implements the technology described herein.

FIG. 1 is a block diagram of one embodiment of a storage system 100 that implements the technology described herein. In one embodiment, storage system 100 is a solid state drive ("SSD"). Storage system 100 may be referred to as a "non-volatile storage system." Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and optional local high speed memory 140 (e.g., DRAM, SRAM, MRAM). Note that local high speed memory 140 is optional. Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with one or more memory die in storage 130. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
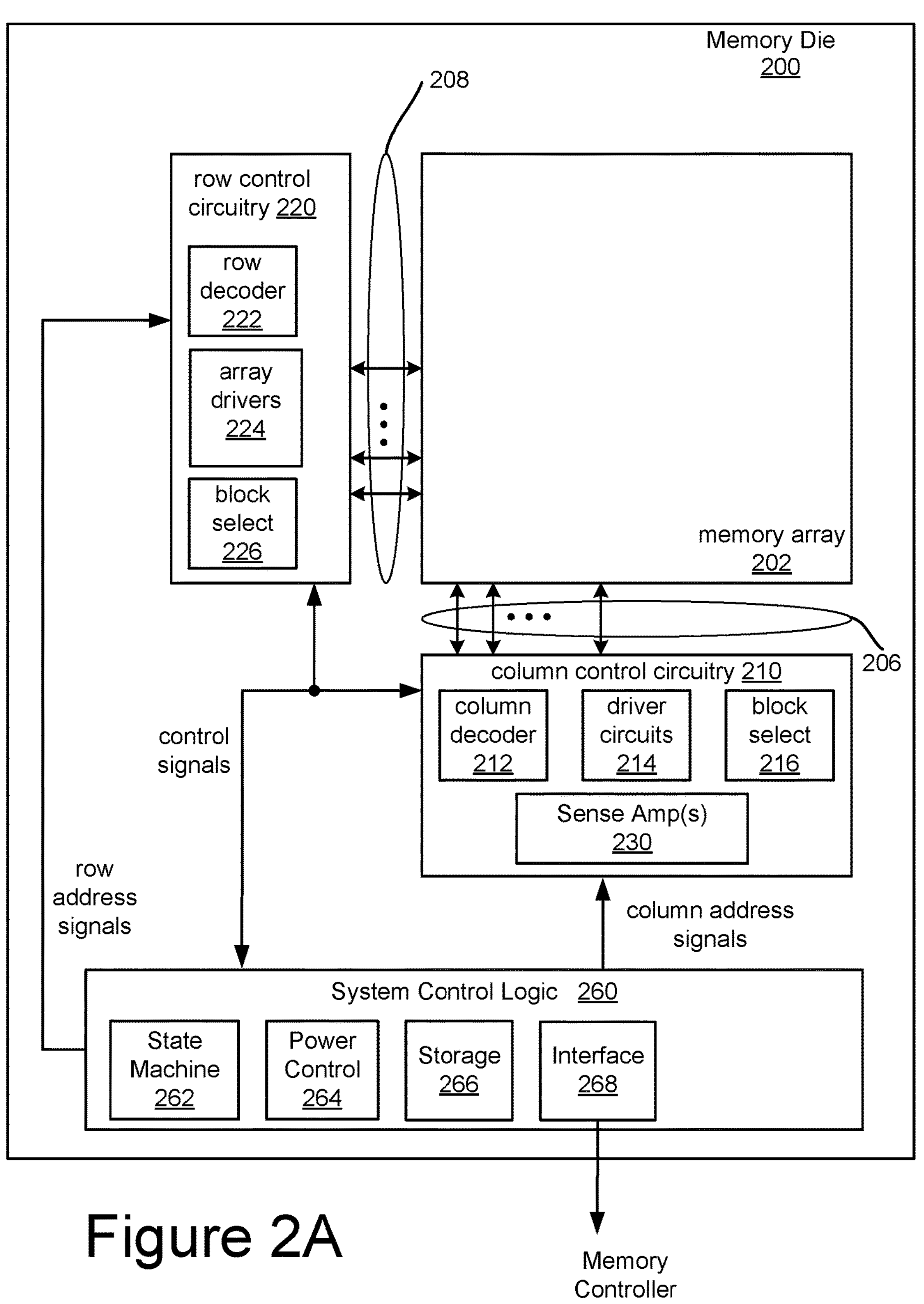
FIG. 2A is a block diagram of one embodiment of a memory die.

FIG. 2A is a functional block diagram of a memory die 200. The components depicted in FIG. 2A are electrical circuits. Memory die 200 includes a non-volatile memory array 202 (which is one example of a non-volatile memory structure) that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from a memory controller and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory array 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between a memory controller and memory die 200 via memory controller interface 268 (also referred to as a "communication interface"). Memory controller interface 268 is an electrical interface for communicating with the memory controller. Examples of memory controller interface 268 include a Toggle Mode Interface and an Open NAND Flash Interface (ONFI). Other I/O interfaces can also be used. The interface 268 may include pins, pads or the like. The interface 268 allows power to be provided to the memory die 200. As an example, a signal referred to as Vcc may supply power and a signal referred to as Vss may be the power supply ground. Other names may be used for these power/voltage signals.

In some embodiments, all the elements of memory die 200, including the system control logic 260, can be formed as part of a single die. In other embodiments, some or all of the system control logic 260 can be formed on a different die.

In one embodiment, memory array 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory array 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory array 202 is not limited to the examples above. Many different types of memory array architectures or memory technologies can be used to form memory array 202. No particular non-volatile memory technology is required for purposes of the new claimed embodiments proposed herein. Other examples of suitable technologies for memory cells of the memory array/structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory array 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory array 202 and (2) peripheral circuitry, where peripheral circuitry includes all of the components depicted in FIG. 2A other than memory array 202. An important characteristic of a memory circuit is its capacity, which can be increased by increasing the area of the memory die of a storage system that is given over to the memory array 202;

however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system is the amount of area to devote to the memory array 202 and the amount of area to devote to the peripheral circuitry.

Another area in which the memory array 202 and the peripheral circuitry are often at odds is in the processing involved in forming these regions, since these regions often involve differing processing technologies and the trade-off in having differing technologies on a single die. For example, when the memory array 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory array 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
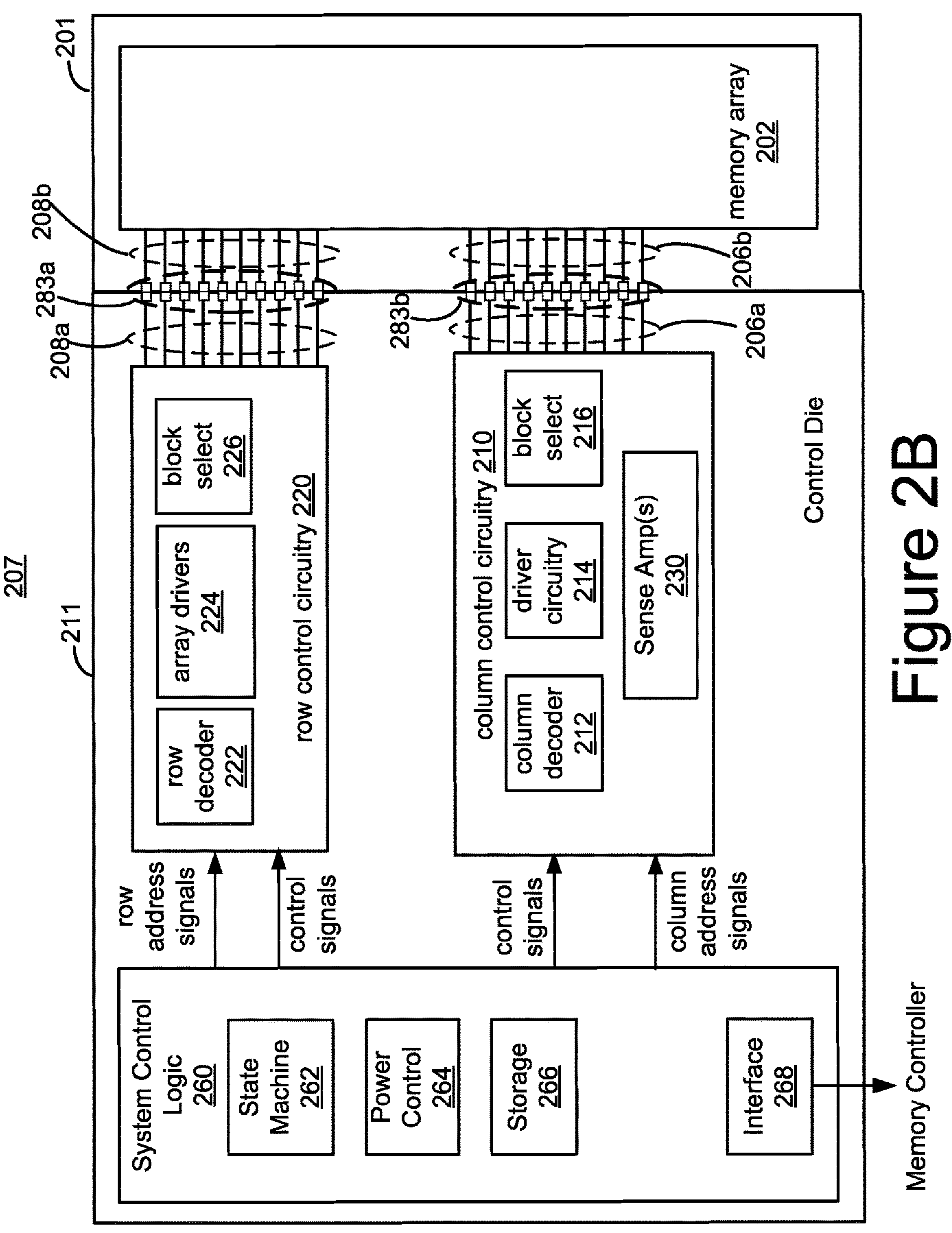
FIG. 2B is a block diagram of one embodiment of an integrated memory assembly.

FIG. 2B shows an alternative arrangement to that of FIG. 2A which may be implemented using wafer-to-wafer bonding to provide a bonded die pair comprising a memory die and a control die. In that regard, FIG. 2B is a functional block diagram of integrated memory assembly 207, which is another embodiment of a memory die assembly. The components depicted in FIG. 2B are electrical circuits. The integrated memory assembly 207 includes two types of semiconductor die (or more succinctly, "die"). Memory array die 201 includes memory array 202. Memory array 202 includes non-volatile memory cells. Control die 211 includes control circuitry 260, 210, and 220 (as described above). In some embodiments, control die 211 is configured to connect to the memory array 202 in the memory array die 201. In some embodiments, the memory array die 201 and the control die 211 are bonded together.

FIG. 2B shows an example of the peripheral circuitry, including control circuits, formed in a peripheral circuit or control die 211 coupled to memory array 202 formed in memory array die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory array die 201. In some embodiments, some of the circuitry in the system control logic 260 is located on the on the memory array die 201.

System control logic 260, row control circuitry 220, and column control circuitry 210 may be formed by a common process (e.g., CMOS process), so that adding elements and functionalities, such as ECC, more typically found on a memory controller may require few or no additional process steps (i.e., the same process steps used to fabricate controller may also be used to fabricate system control logic 260, row control circuitry 220, and column control circuitry 210). Thus, while moving such circuits from a die such as memory array die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220. In an embodiment, the control die 211 is bonded to the memory array die 201 by a large number of bond pads 283*a*, 283*b*.

FIG. 2B shows column control circuitry 210 including sense amplifier(s) 230 on the control die 211 coupled to memory array 202 on the memory array die 201 through input/outputs 206. The input/outputs 206 may comprise electrical connections between column decoder 212, driver circuitry 214, and block select 216 and bit lines of memory array 202. The input/outputs 206 may be referred to as electrical paths. A portion of the electrical path 206*a* is on the control die 211 and a second portion of the electrical path 206*b* is on the memory array die. The two portions 206*a*, 206*b* are connected by bond pads 283*b*. Thus, electrical paths may extend from column control circuitry 210 in control die 211 through pads on control die 211 that are bonded to corresponding pads of the memory array die 201, which are connected to bit lines of memory array 202. Each bit line of memory array 202 may have a corresponding electrical path in electrical paths 206, including a pair of bond pads, which connects to column control circuitry 210. Similarly, row control circuitry 220, including row decoder 222, array drivers 224, and block select 226 are coupled to memory array 202 through electrical paths 208. Each of electrical path 208 may correspond to a word line, dummy word line, or select gate line. First portions of the electrical paths 208*a* on control die 211 are connected to second portions of the electrical paths 208*b* on memory array die 201 by way of bond pads 283*a*. Additional electrical paths may also be provided between control die 211 and memory array die 201.

Note that the array drivers 224 in both the memory die 200 and the control die 211 may contain WL switch transistors. Reducing the size of the WL switch transistors helps to reduce the overall area needed for the WL switch transistors. In some embodiments, the WL switch transistors reside on the memory die 200 in a substrate under the memory structure 202 in a "circuit under array" (CuA) architecture. In some embodiments, the WL switch transistors reside on the memory die 200 in "peripheral circuitry" adjacent to memory structure 202. In some embodiments, the WL switch transistors reside in a separate CMOS chip (e.g., the control die 211). Embodiments of circuitry for providing separate voltages to gates of WL switch transistors and to the well in which the WL switch transistors reside facilitate reduction in the size of the WL switch transistors. Therefore, the area needed for the WL switch transistors on the CMOS chip (e.g., the control die 211) can be reduced. Also, the area needed for the WL switch transistors on the memory die 200 can be reduced if the WL switch transistors reside on the memory die 200.

For purposes of this document, the phrases "a control circuit" or "one or more control circuits" can include any one of or any combination of state machine 262, all or a portion of system control logic 260 (all or a portion of row control circuitry 220, all or a portion of column control circuitry 210), a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

Figure 3A:
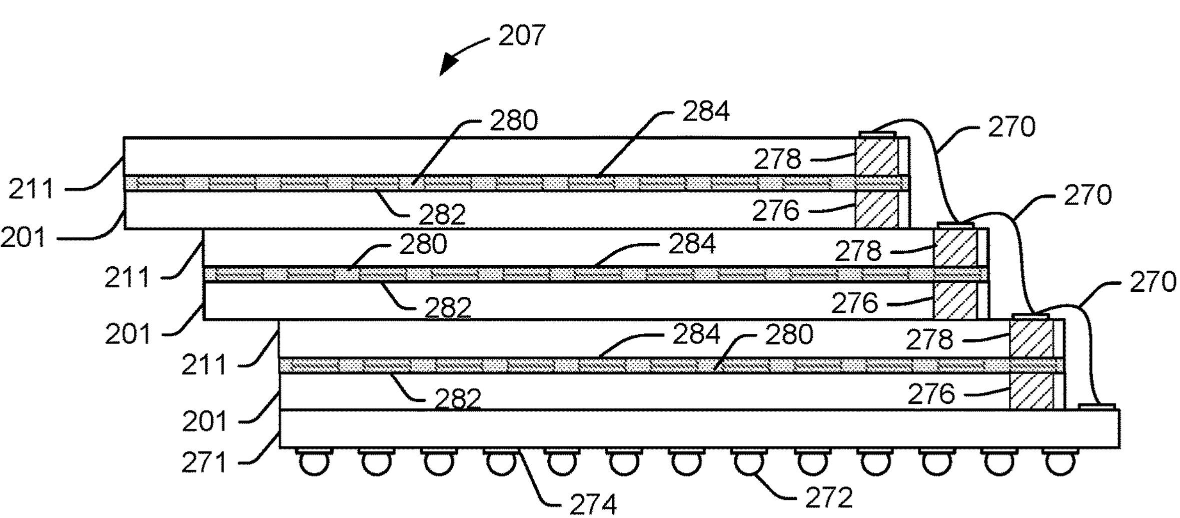
FIGS. 3A and 3B depict different embodiments of integrated memory assemblies.

In some embodiments, there is more than one control die 211 and more than one memory array die 201 in an integrated memory assembly 207. In some embodiments, the integrated memory assembly 207 includes a stack of multiple control die 211 and multiple memory array die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory array die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and a memory controller.

Figure 3B:
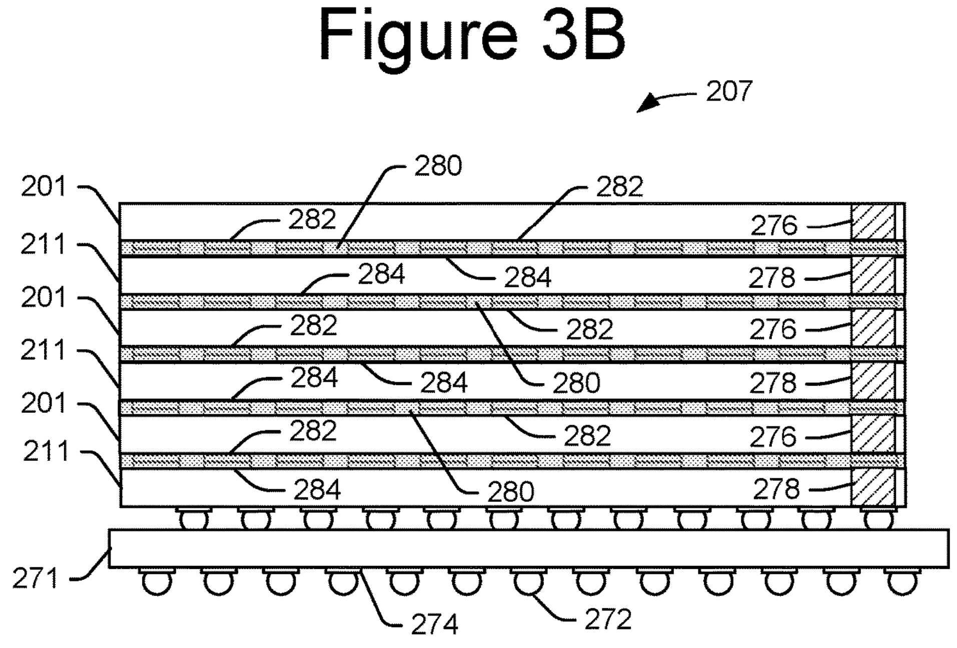

FIG. 3B depicts a side view of another embodiment of an integrated memory assembly 207 stacked on a substrate 271. The integrated memory assembly 207 of FIG. 2B has three control die 211 and three memory array die 201. In some embodiments, there are many more than three memory dies 201 and many more than three control dies 211. In this example, each control die 211 is bonded to at least one memory array die 201. Optionally, a control die 211 may be bonded to two or more memory array die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory array die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory array die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material.

Figure 4:
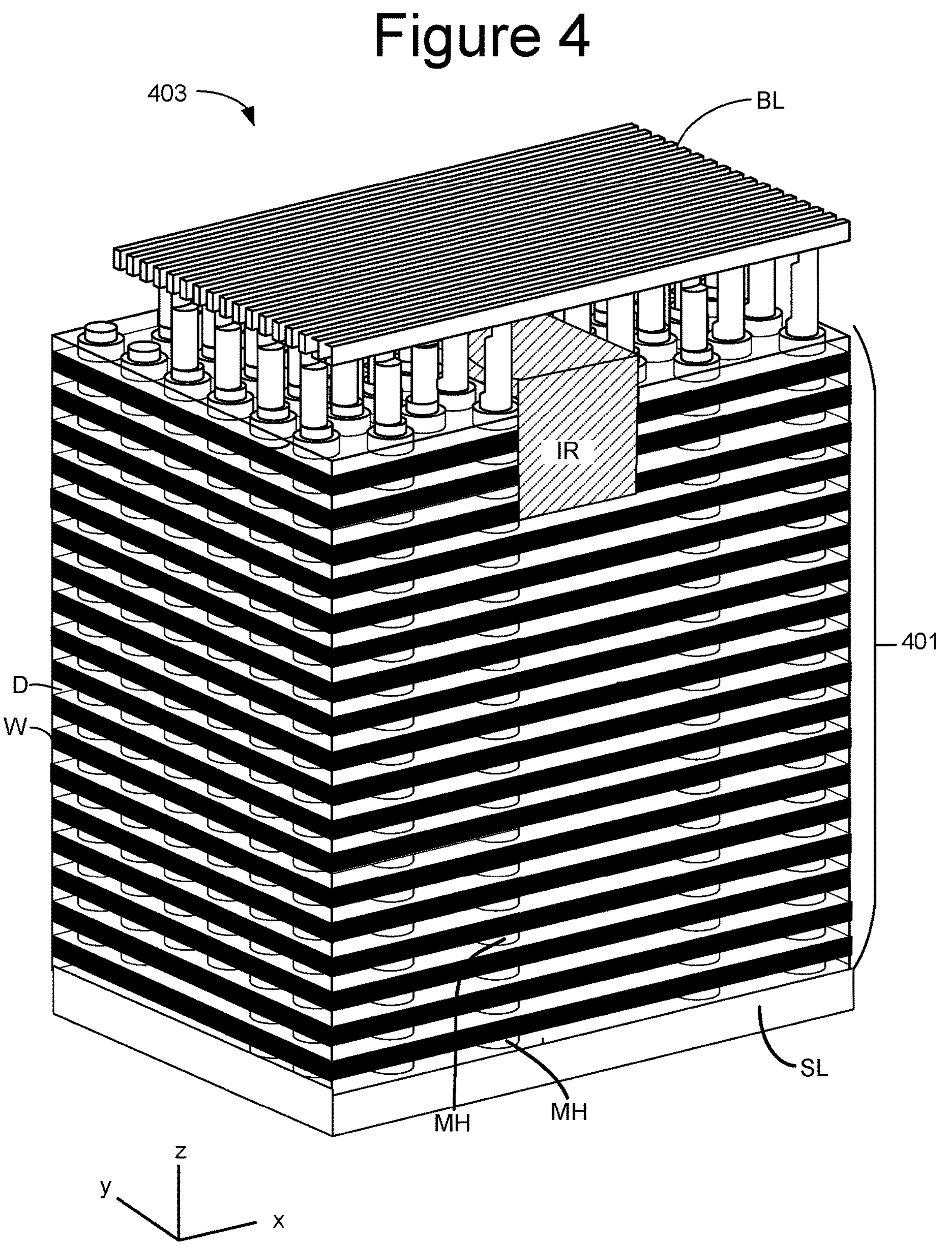
FIG. 4 is a perspective view of a portion of one example of a monolithic three dimensional memory structure.

FIG. 4 is a perspective view of a portion of one example of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
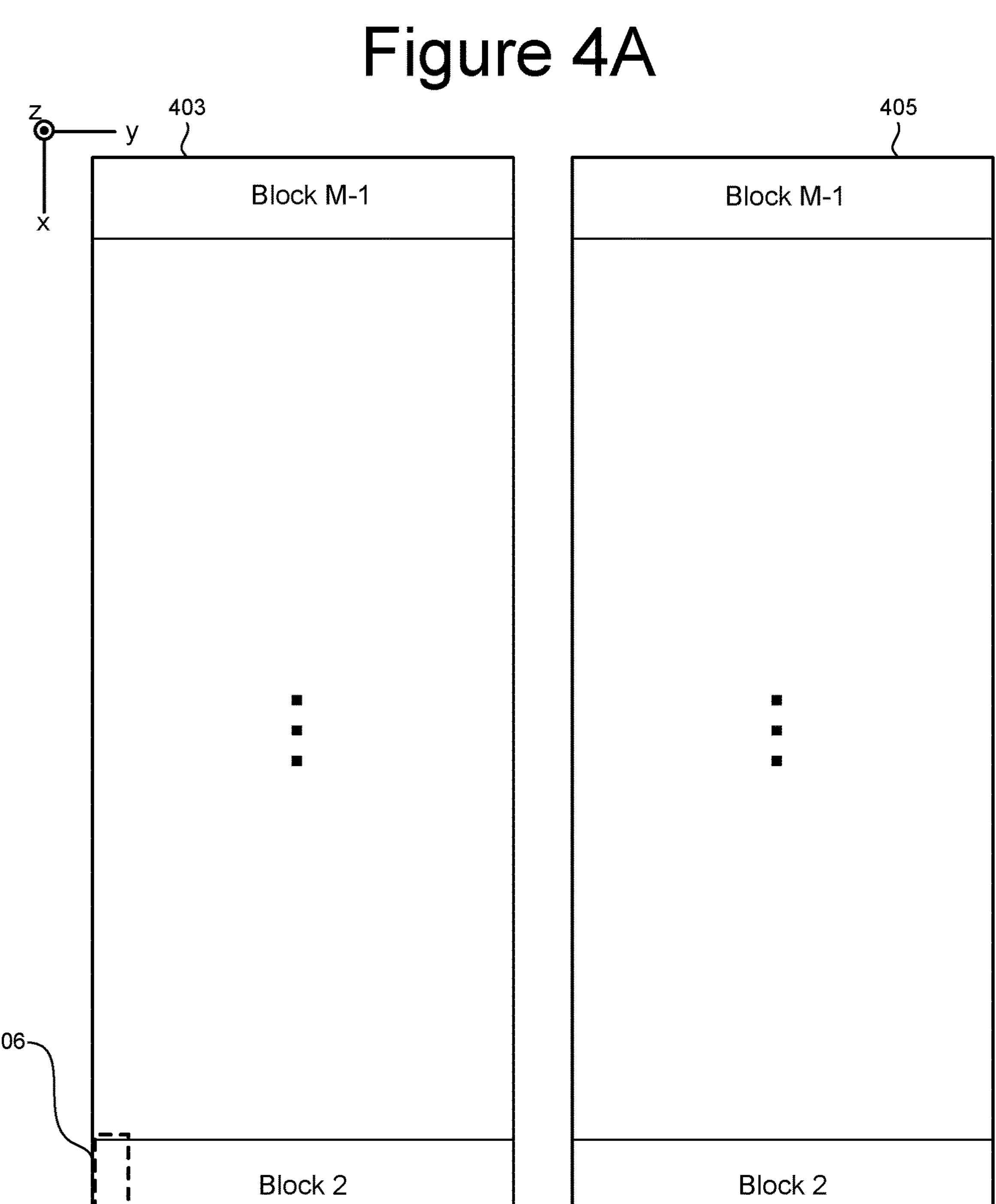
FIG. 4A is a block diagram of one example of a memory structure having two planes.

FIG. 4A is a block diagram explaining one example organization of memory structure 202, which is divided into two planes 403 and 405. Each plane is then divided into M physical blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a group of connected memory cells as the memory cells of a block share a common set of word lines. For example, the word lines for a physical block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
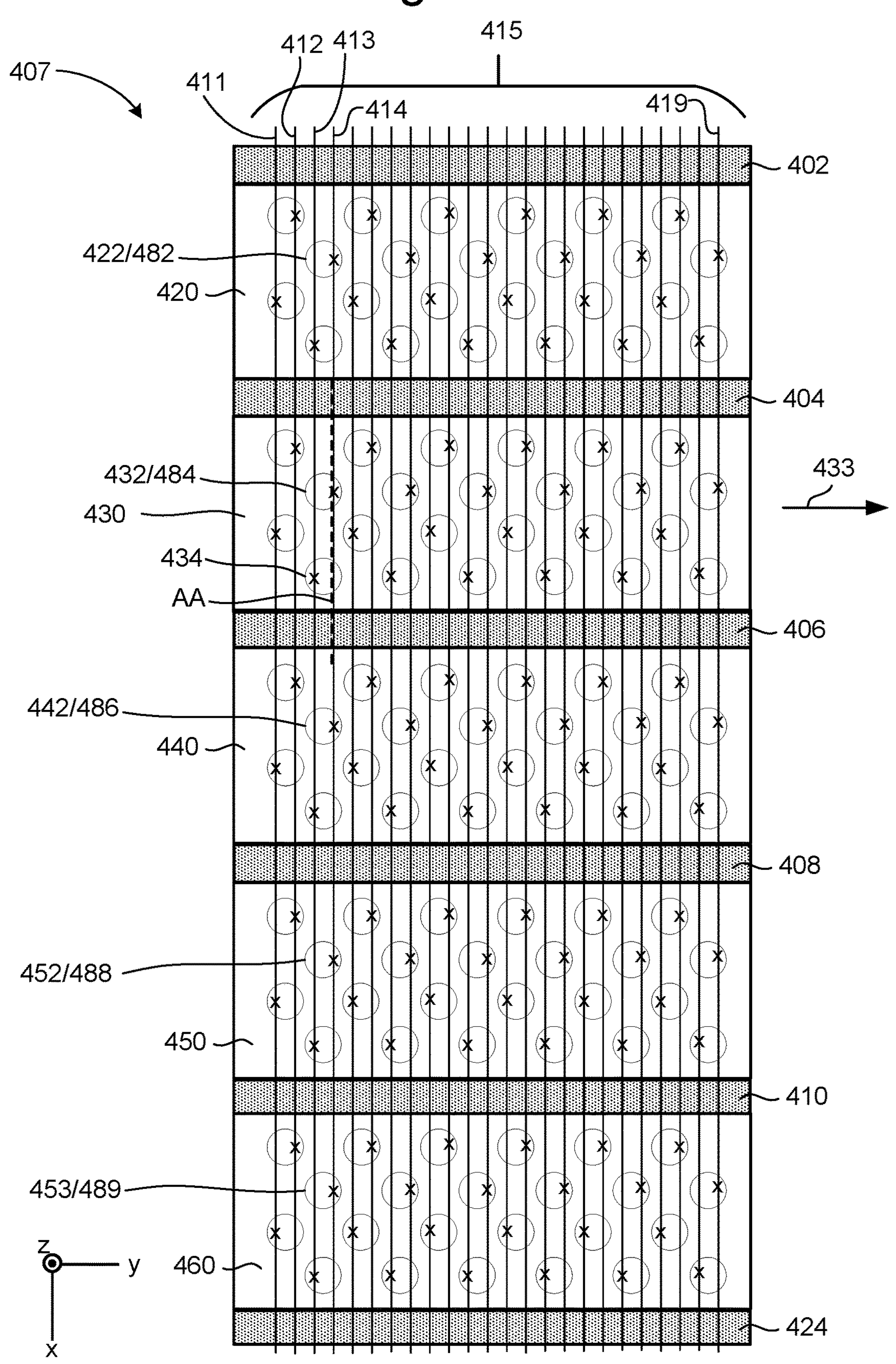
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442, 452 and 453.

The physical block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the block 407 from adjacent physical blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408, or 410. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
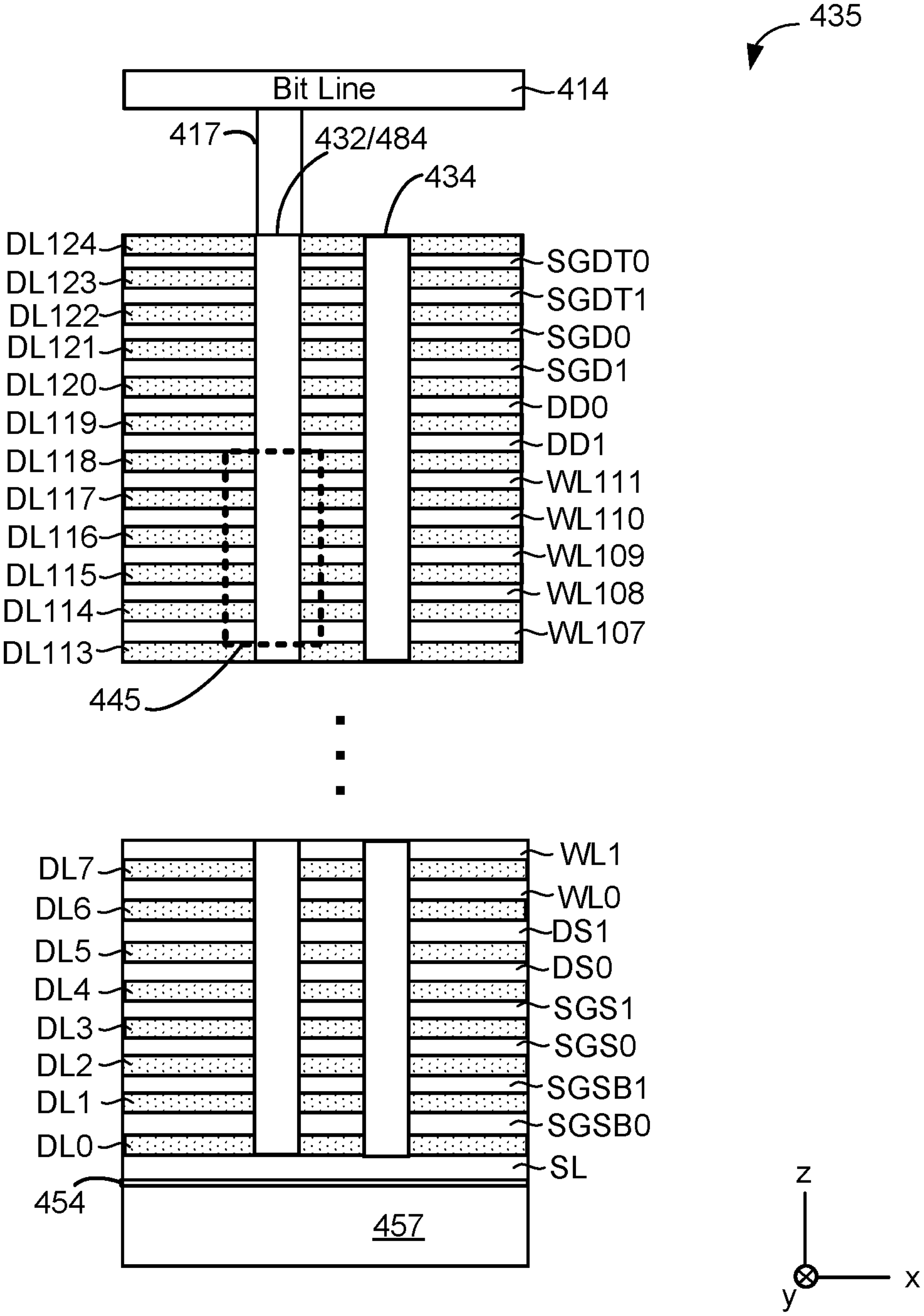
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Four dummy word line layers DD0, DD1, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Figure 4D:
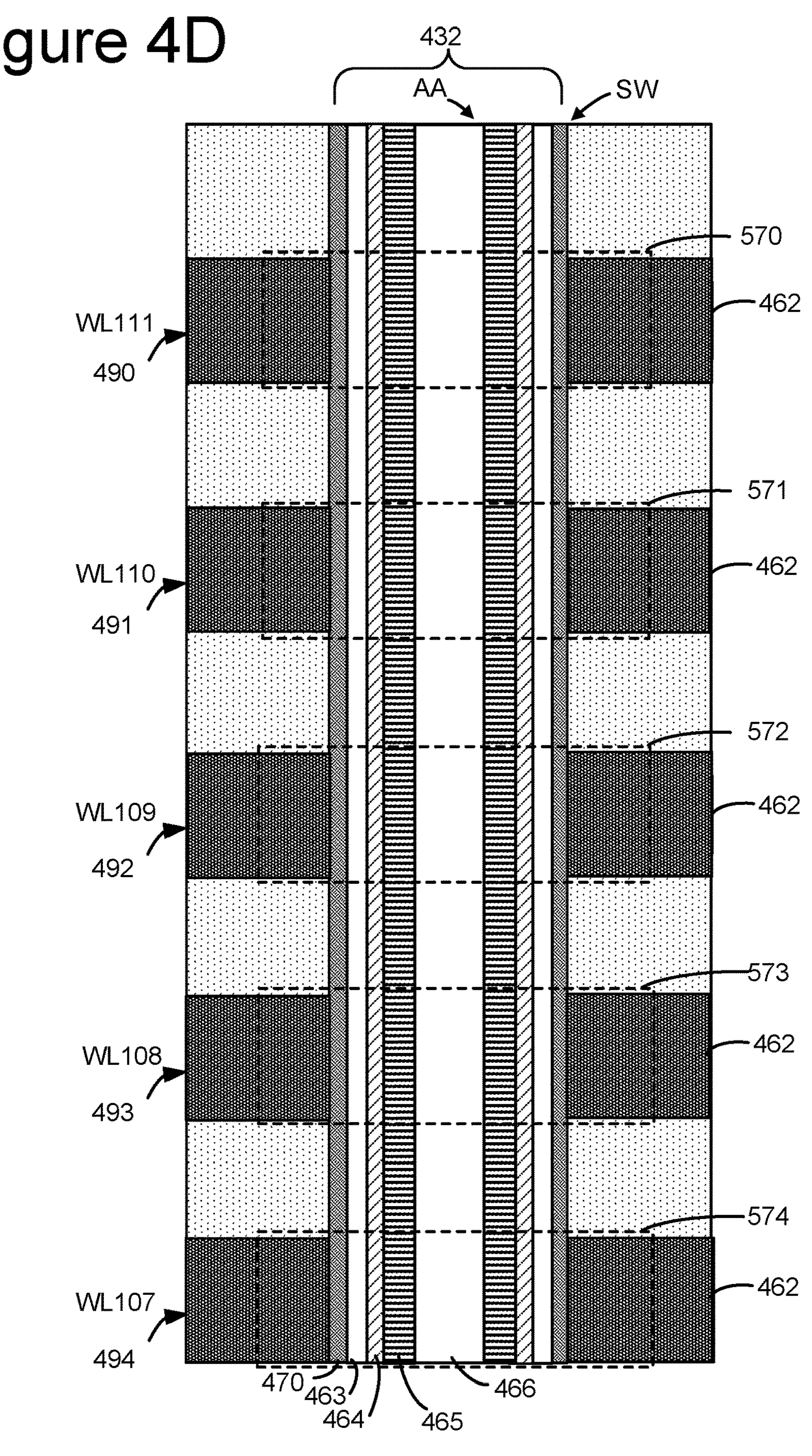
FIG. 4D depicts a view of the region 445 of FIG. 4C.

FIG. 4D depicts a view of the region 445 of FIG. 4C. Data memory cell transistors 570, 571, 572, 573, and 574 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
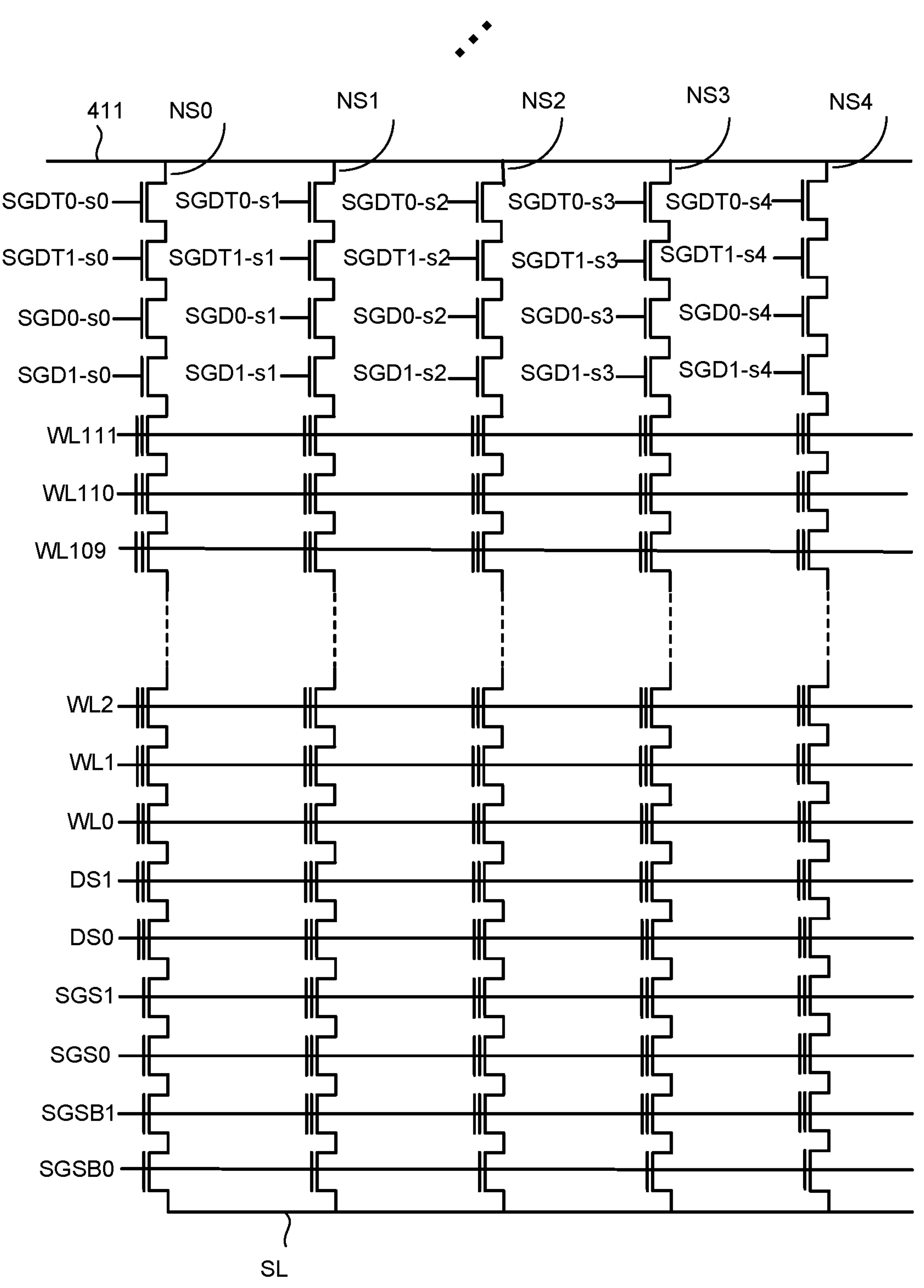
FIG. 4E is a schematic diagram of a portion of one example of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-*s*0, SGDT1-*s*0, SGD0-*s*0, and SGD1-*s*0. The set of drain side select lines connected to NS1 include SGDT0-*s*1, SGDT1-*s*1, SGD0-*s*1, and SGD1-*s*1. The set of drain side select lines connected to NS2 include SGDT0-*s*2, SGDT1-*s*2, SGD0-*s*2, and SGD1-*s*2. The set of drain side select lines connected to NS3 include SGDT0-*s*3, SGDT1-*s*3, SGD0-*s*3, and SGD1-*s*3. The set of drain side select lines connected to NS4 include SGDT0-*s*4, SGDT1-*s*4, SGD0-*s*4, and SGD1-*s*4. Herein the term "SGD" may be used as a general term to refer to any one or more of the lines in a set of drain side select lines. In an embodiment, each line in a given set may be operated independent from the other lines in that set to allow for different voltages to the gates of the five drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-*s*0, SGDT1-*s*0, SGD0-*s*0, and SGD1-*s*0. A second sub-block corresponds to those vertical NAND strings controlled by SGDT0-*s*1, SGDT1-*s*1, SGD0-*s*1, and SGD1-*s*1. A third sub-block corresponds to those vertical NAND strings controlled by SGDT0-*s*2, SGDT1-*s*2, SGD0-*s*2, and SGD1-*s*2. A fourth sub-block corresponds to those vertical NAND strings controlled by SGDT0-*s*3, SGDT1-*s*3, SGD0-*s*3, and SGD1-*s*3. A fifth sub-block corresponds to those vertical NAND strings controlled by SGDT0-*s*4, SGDT1-*s*4, SGD0-*s*4, and SGD1-*s*4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL61 may be in the lower tier and memory cells connected to WL62-WL111 may be in the upper tier. Hence, memory cells connected to WL0-WL61 may be in one erase block and memory cells connected to WL62-WL111 may be in another erase block. A physical block could be operated in more than two tiers. Erase blocks can be formed based on other divisions of physical blocks.

Although the example memories of FIGS. 4-4E are three dimensional memory structure that includes vertical NAND strings with charge-trapping material, other 3D memory structures can also be used with the technology described herein.

Figure 5A:
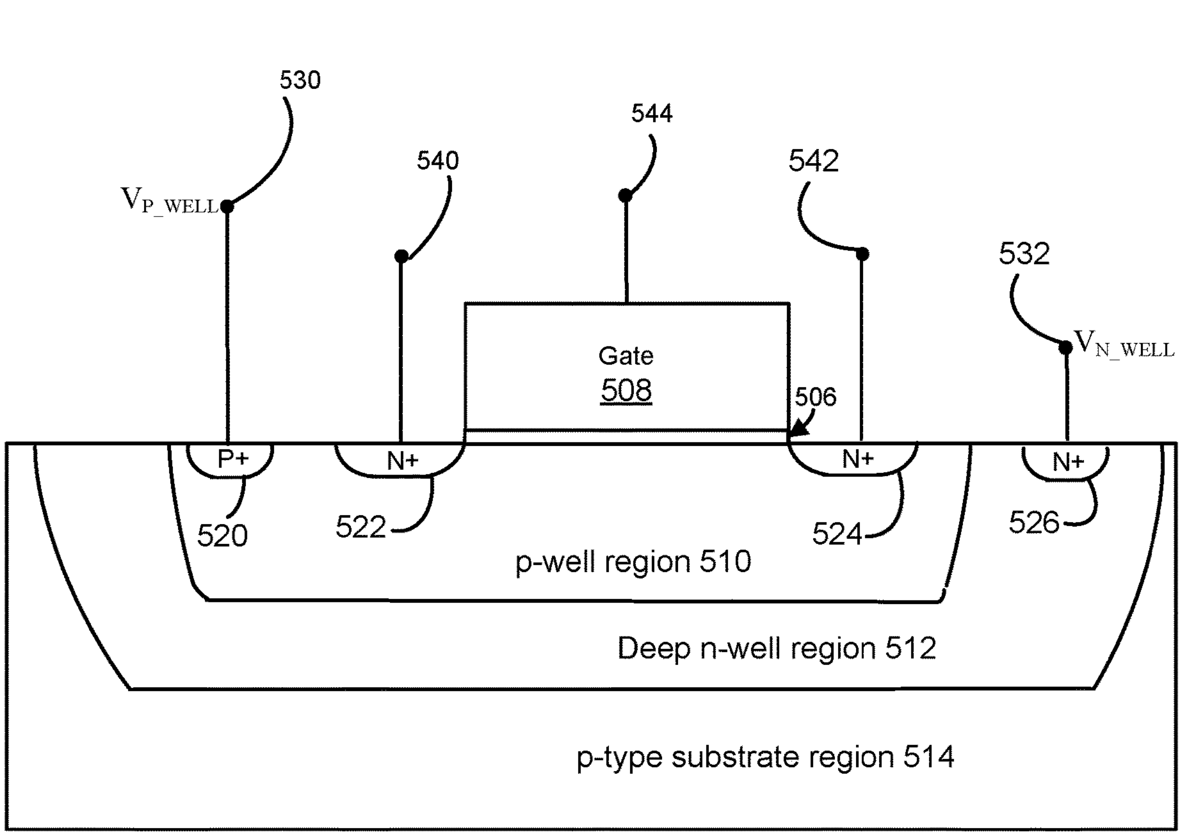
FIGS. 5A and 5B are diagrams of examples of word line (WL) switch transistors.

FIG. 5A is a diagram of an example of a word line (WL) switch transistor. The WL switch transistor 500 may be used to provide a voltage to a word line in a selected block. In an embodiment, the WL switch transistor 500 resides in one or more wells with other WL switch transistors. Other transistors in addition to the WL switch transistors may optionally reside in the one or more wells. FIG. 5A depicts a p-well region 510 within a deep n-well region 512, which in turn is within a p-type substrate region 514.

The p-well region 510 has a P+ region 520 in one embodiment to provide better electrical contact to terminal 530 for applying a p-well voltage $V_{P\_WELL}$ to p-well region 510. The deep n-well region 512 has an N+ region 526 to provide better electrical contact to terminal 532 for applying a n-well voltage $V_{N\_WELL}$ to deep n-well region 512. Note that it is not required that there be a separate P+ region 520 for each WL switch transistor 500 in the p-well 510. Likewise, it is not required that there be a separate N+ region 526 for each WL switch transistor 500 in the deep n-well 512.

In an embodiment, the WL switch transistor 500 has two N+ regions 522, 524, one of which may be a source and the other a drain. One N+ region 522 is connected to one of the word lines in the memory array 202 via terminal 540 (and can be referred to as an output terminal). A voltage may be applied to the other N+ region 524 via terminal 542 (input terminal) to be transferred to the output terminal when WL switch transistor 500 has been turned on. The transistor has a gate 508 over a gate oxide 506. A gate voltage may be applied to gate 508 via terminal 544 (selection terminal) to turn WL switch transistor 500 on or off. In one embodiment, a "selection voltage" (e.g., BLK_sel) is applied to the gate 508 to turn transistor 500 on, and an "unselect voltage" (e.g., BLK_unsel) is applied to the gate 508 to keep transistor 500 off. In one embodiment, to turn on transistor 500, the selection voltage at selection terminal 544 should be above the magnitude of the input voltage at the input terminal 542 by at least the threshold voltage of transistor 500. If a selection voltage is used to turn on the transistor 500, the input voltage at the input terminal 542 may be passed through to the word line.

An embodiment of a memory system provides for separate control of the voltages to the gate 508 and the p-well region 510. In an embodiment, a negative BLK_unsel voltage is applied to the gate 508 while providing a non-negative (e.g., 0V) voltage to the p-well 510. In an embodiment, a non-negative BLK_unsel voltage (e.g., 0V) is applied to the gate 508 while providing a negative voltage to the p-well 510. Other combinations of voltages to the gate 508 and p-well 510 are also possible. In one embodiment, the p-type substrate region 514 and the deep n-well 512 remain grounded while operating the memory device. The combinations of voltages applied to the gate 508 and p-well region 510 may reduce leakage current in WL switch transistor 500, which may thereby allow transistor 500 to be reduced in size. Moreover, as will be elaborated in more detail below, the circuitry used to provide the combinations of voltages applied to the gate 508 and p-well region 510 occupies little area. Also, in an embodiment, the circuitry used to pass on the voltages to the gate 508 may reside in the same p-well 510 as the WL switch transistor 500 thereby saving area.

Figure 5B:
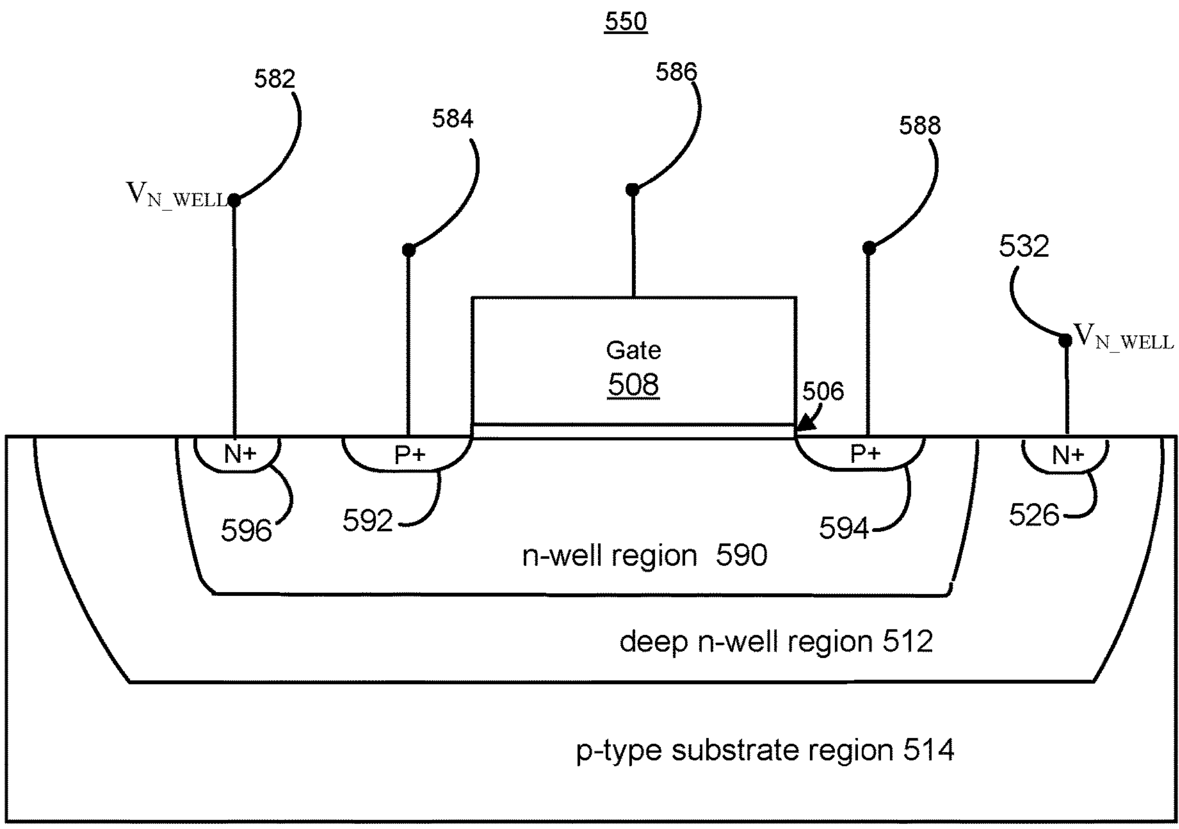

The WL switch transistor 500 in FIG. 5A is an NMOS transistor. However, the WL switch is not limited to NMOS. In one embodiment, the WL switch includes a PMOS transistor. FIG. 5B is a diagram of an example of a word line (WL) switch transistor that includes a PMOS device. The WL switch transistor 550 resides in n-well region 590, which in turn is within a deep n-well region 512, which in turn is within a p-type substrate region 514. The n-well region 590 has a N+ region 596 to provide better electrical contact to terminal 582 for applying an n-well voltage $V_{N\_WELL}$ to n-well region 590. Note that it is not required that there be a separate N+ region 596 for each WL switch transistor 550 in the n-well 590. The deep n-well region 512 has an N+ region 526 to provide better electrical contact to terminal 532 for applying a n-well voltage $V_{N\_WELL}$ to n-well region 512.

In an embodiment, the WL switch transistor 550 has two P+ regions 592, 594, one of which may be a source and the other a drain. One P+ region 592 is connected to one of the word lines in the memory array 202 via terminal 584 (and can be referred to as an output terminal). A voltage may be applied to the other P+ region 594 via terminal 588 (input terminal) to be transferred to the output terminal when WL switch transistor 550 has been turned on. The transistor has a gate 508 over a gate oxide 506. A gate voltage may be applied to gate 508 via terminal 586 (selection terminal) to turn WL switch transistor 550 on or off. In one embodiment, a "selection voltage" (e.g., BLK_sel) is applied to the gate 508 to turn transistor 550 on, and an "unselect voltage" (e.g., BLK_unsel) is applied to the gate 508 to keep transistor 550 off. If a selection voltage is used to turn on the transistor 550, the input voltage may be passed through to the word line.

An embodiment of a memory system provides for separate control of the voltages to the gate 508 and the n-well region 590. In an embodiment, a negative BLK_unsel voltage is applied to the gate 508 while providing a non-negative (e.g., 0V) voltage to the n-well region 590. In an embodiment, a non-negative BLK_unsel voltage (e.g., 0V) is applied to the gate 508 while providing a negative voltage to n-well region 590. Other combinations of voltages to the gate 508 and n-well region 590 are also possible. In one embodiment, the p-type substrate region 514 and the deep n-well 512 remain grounded while operating the memory device. The combinations of voltages applied to the gate 508 and n-well region 590 may reduce leakage current in WL switch transistor 500, which may thereby allow transistor 550 to be reduced in size. Moreover, the circuitry used to provide the combinations of voltages applied to the gate 508 and n-well region 590 occupies little area.

Figure 6:
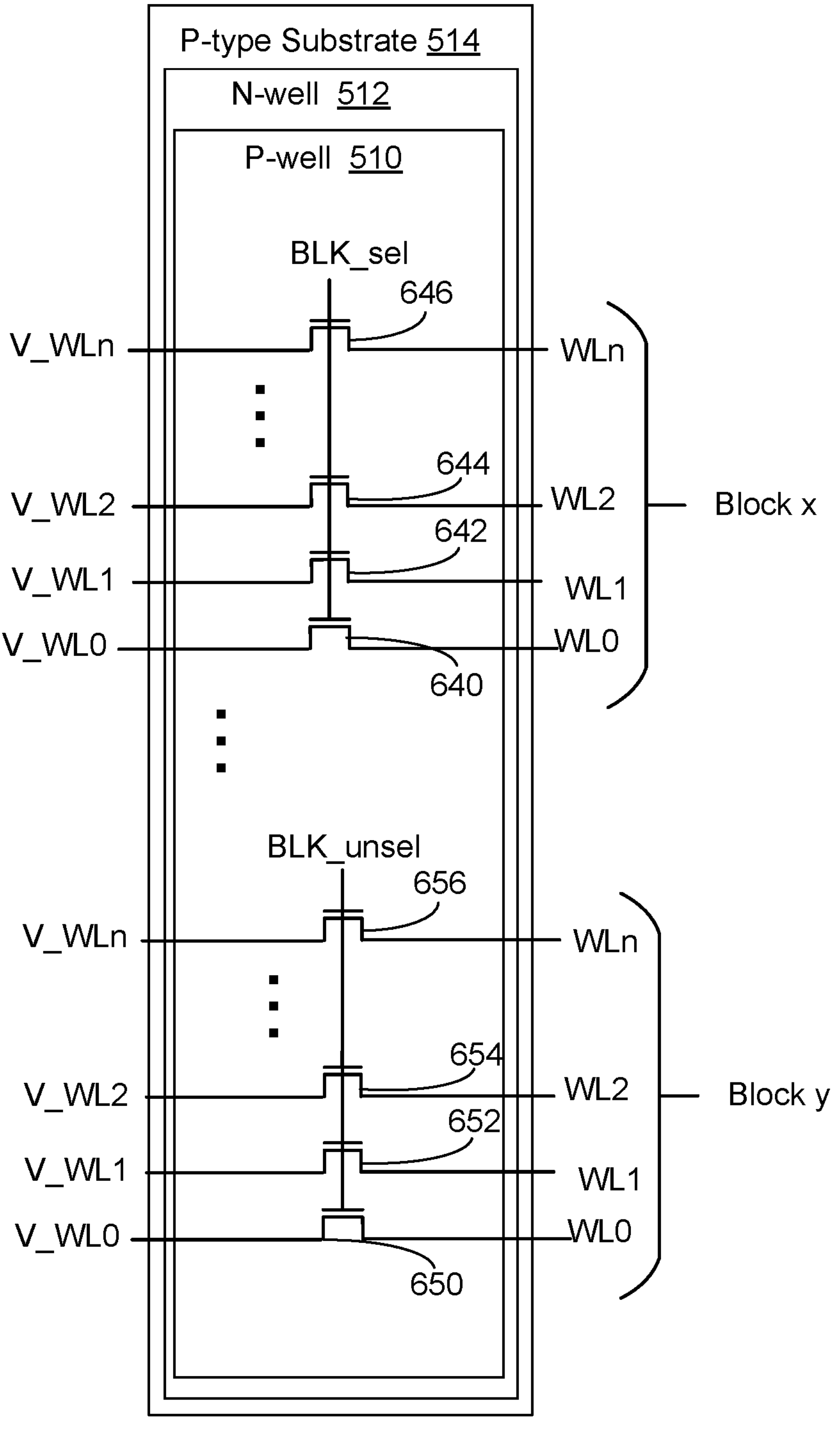
FIG. 6 is a schematic diagram of showing a few WL switch transistors in a well.

FIG. 6 is a schematic diagram of showing a few WL switch transistors. The WL switch transistors reside in a P-well 510, which is in a deep N-well 512, which is in a P-type substrate 514). FIG. 6 shows a few of the WL switch transistors that are used for two of the many blocks (Block x, Block y) in a plane. In this example, Block x has been selected for a memory operation (e.g., read, program, erase) and Block y is one of the many blocks in the plane that has not been selected for a memory operation. The WL switch transistors for the other unselected blocks in the plane are not depicted in FIG. 6. Note that transistors other than WL switch transistors may also reside in the p-well 510, deep N-well 512 and/or P-type substrate 514.

A first set of WL switch transistors 640, 642, 644, and 646 are used to provide voltages to word lines in Block X. The signal BLK_sel is applied to the gates of WL switch transistors 640, 642, 644, and 646 to cause those transistors to pass the voltages (V_WL0, V_WL1, V_WL2, . . . V_WLn) to the corresponding word lines (WL0, WL1, WL2, . . . WLn). Only a few of the many WL switch transistors associated with Block X are depicted in FIG. 6. In this example, there are n+1 word lines in a block. As an example, there may be hundreds of word lines in a block. A second set of WL switch transistors 650, 652, 654, and 656 are used to provide voltages to word lines in Block y when Block y is the selected block. However, in this example Block y is not selected due to the BLK_unsel voltage applied to the gates of WL switch transistors 650, 652, 654, and 656. Therefore, WL switch transistors 650, 652, 654, and 656 will be off and the voltages (V_WL0, V_WL1, V_WL2, . . . V_WLn) will not be passed to the corresponding word lines in unselected Block y.

Techniques are disclosed herein for providing the BLK_unsel signal to the gates of the WL switch transistors 650, 652, 654, and 656 associated with unselected blocks while providing a voltage to the P-well 510. In an embodiment, one of these two voltages is negative and the other is non-negative (e.g., 0V). In an embodiment, the BLK_sel voltage is negative and the P-well voltage is non-negative (e.g., 0V). In an embodiment, the BLK_sel voltage is non-negative (e.g., 0V) and the P-well voltage is negative. However, other combinations of voltages may be used. Also, the gate and well voltages for read, erase, and program operations may be handled differently. Moreover, circuitry used to allow for the flexibility in voltage assignments occupies very little area. Further details are discussed below.

Figure 7:
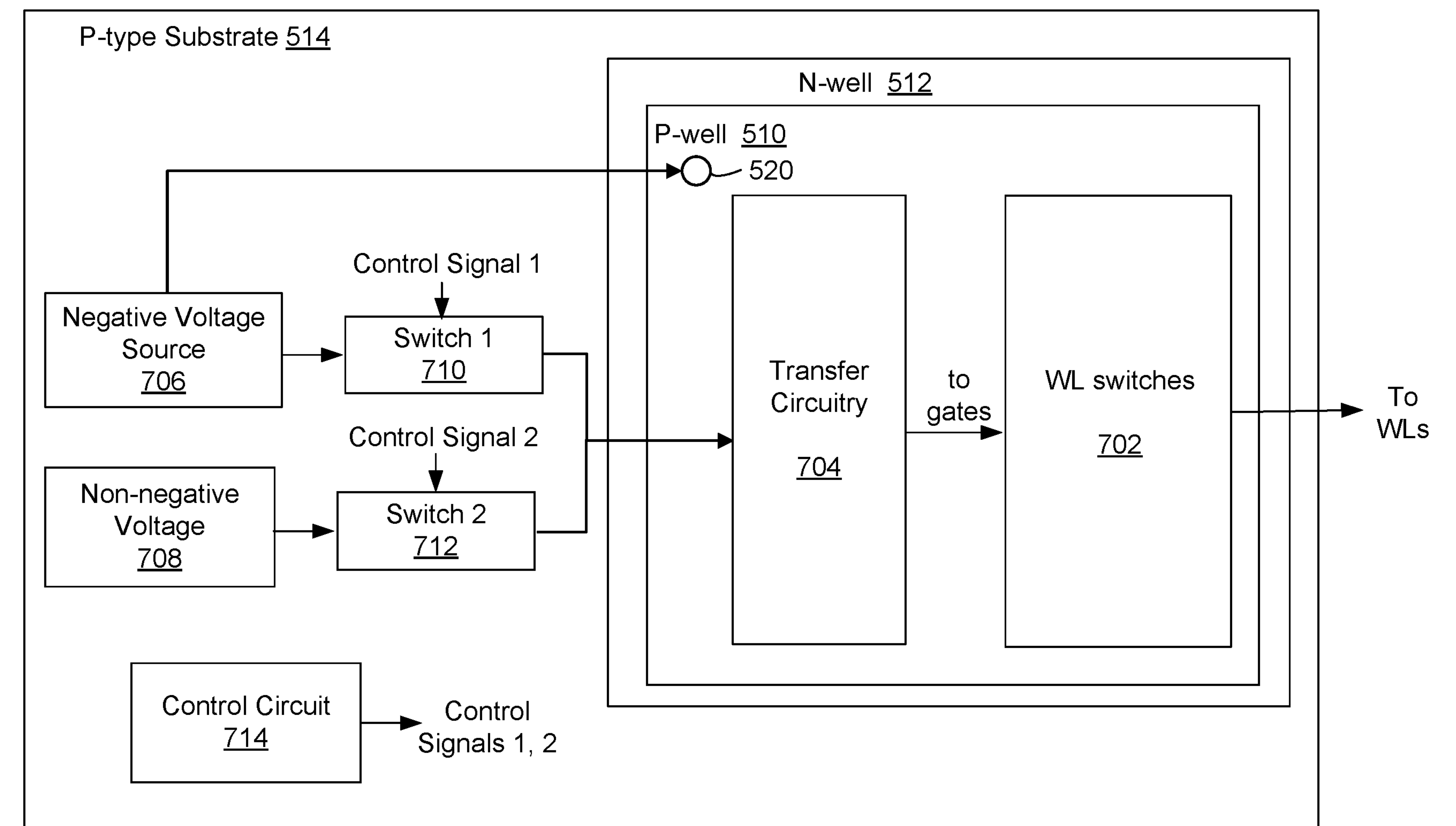
FIG. 7 is a block diagram of an embodiment of an apparatus for controlling the voltages to word line switches.

FIG. 7 is a block diagram of an embodiment of an apparatus 700 for controlling the voltages to word line select transistors. In one embodiment, the apparatus resides on control die 211. In one embodiment, the apparatus resides on memory die 200 with the memory structure 202. The WL switches 702 reside in P-well 510, which is in deep N-well 512. Both wells 510, 512 reside in the p-type substrate 514. Each WL switch transistor is connected to a word line in the memory structure. In an embodiment the WL switches 702 include all of the WL switches for one plane. However, it is not required that all of the WL switches 702 for one plane be in the same p-well.

Transfer circuitry 704 also resides in the P-well 510. The transfer circuitry 704 contains transistors that share the p-well 510 with the WL switch transistors 702. The transfer circuitry is used to provide a BLK_unsel voltage to the gates of the WL switch transistors 702. Thus, the transfer circuitry 704 may be used to provide voltages to the gates of the WL switch transistors 702 that are associated with unselected blocks. In an embodiment, the BLK_sel voltage (see FIG. 6) is provided by circuitry not depicted in FIG. 7.

The negative voltage source 706 is configured to output a negative voltage. The negative voltage source 706 may contain one or more charge pumps. The magnitude of the negative voltage is controllable. For example, the control circuit 714 may send a signal (e.g., code) that selects the magnitude of the voltage. Thus, the negative voltage source 706 may output a range of negative voltages. The range may vary depending on needs. As an example, the range of negative voltages could be between −0.1 V to −5V; however, the negative voltage source 706 is not limited to this range.

The non-negative voltage circuitry 708 provides a non-negative voltage. The term "non-negative voltage," as used throughout this disclosure means voltages greater than or equal to 0V. In one embodiment, the non-negative voltage is a ground voltage (0V), which may be referred to as Vss. The non-negative voltage circuitry 708 could include one or more charge pumps, but charge pumps are not required. In one embodiment, the non-negative voltage is provided to the chip by way of a pin or the like (e.g., Vss may be provided on interface 268). Thus, negative voltage circuitry 708 may include circuitry that simply passes through a voltage without changing the magnitude of the voltage.

The negative voltage source 706 is connected to the P+ region 520 in the p-well region 510 in order to provide the negative voltage to the p-well region 510. In an embodiment, the deep N-well region 512 is at ground and the P-type substrate are at ground. A first switch 710 (Switch 1) is connected between the negative voltage source 706 and an input of the transfer circuitry 704. The first switch 710 is configured to selectively provide the negative voltage to the input of the transfer circuitry 704. The first switch 710 responds to a control signal 1 to either pass the negative voltage to the input of the transfer circuitry 704 or prevent the negative voltage from passing to the input of the transfer circuitry 704.

A second switch 712 (Switch 2) is connected between non-negative voltage circuitry 708 and the input of the transfer circuitry 704. The second switch 712 is configured to selectively provide the non-negative voltage to the input of the transfer circuitry 704. The second switch 712 responds to a control signal 2 to either pass the non-negative voltage to the input of the transfer circuitry 704 or prevent the non-negative voltage from passing to the input of the transfer circuitry 704.

The control circuit 714 provides the control signals to the switches 710, 712. The control circuit 714 thus controls whether the negative voltage or the non-negative voltage is provided to the input of the transfer circuitry 704. An output of the transfer circuitry 704 is connected to the gates of the WL switches. Therefore, the transfer circuitry 704 passes either the negative voltage or the non-negative voltage to the gates of the WL switches associated with the unselected blocks. Note that the voltage to the gates of the WL switches associated with the selected block is provided by other circuitry (not depicted in FIG. 7).

A technical benefit of the apparatus in FIG. 7 is that both the WL switches 702 and the transfer circuitry 704 reside in the same p-well 510. If the WL switches 702 and the transfer circuitry 704 were to reside in different p-wells then there may need to be an isolation region between the two p-wells, which would take up additional area on the p-type substrate 514.

Figure 8:
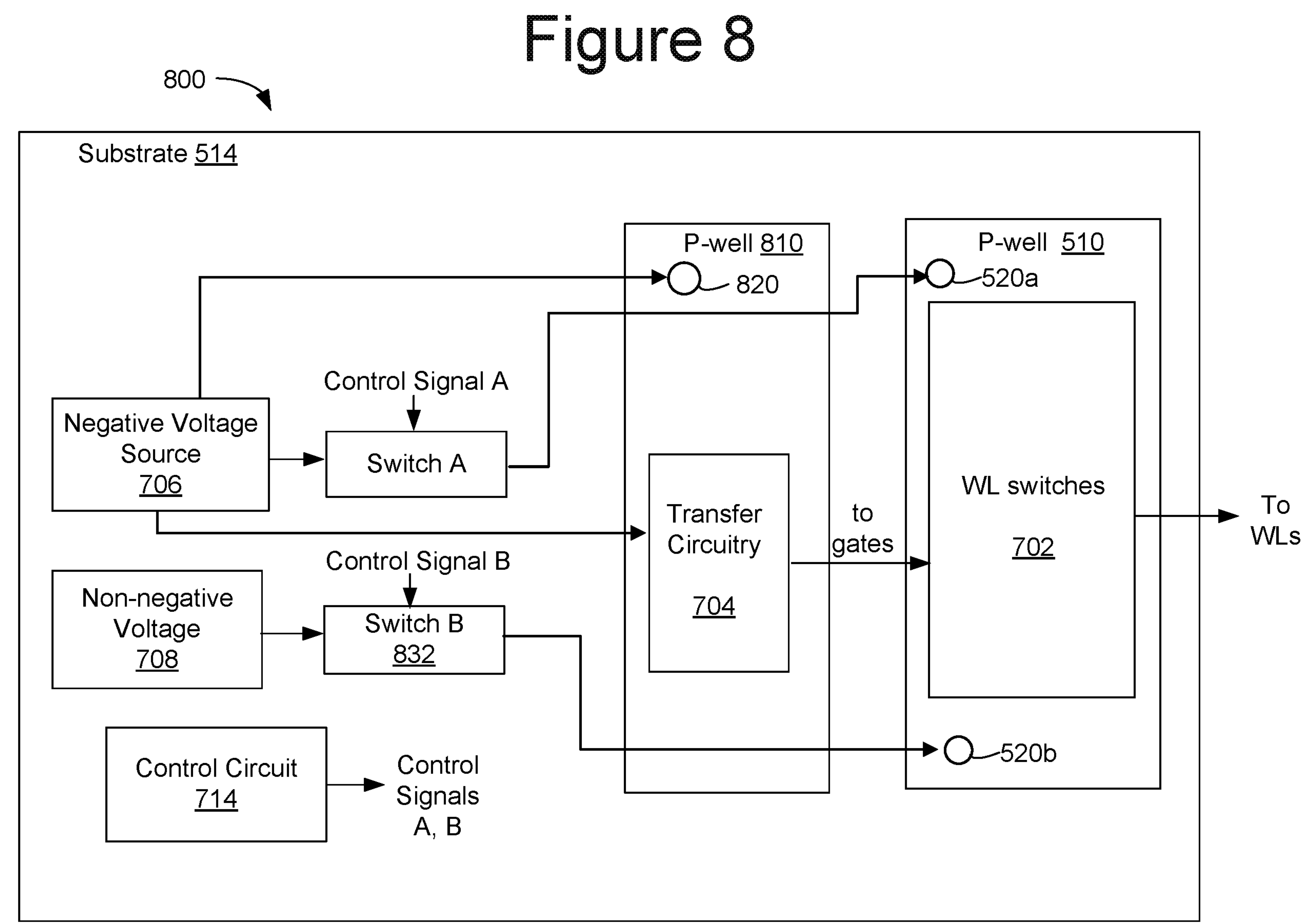
FIG. 8 is a block diagram of another embodiment of an apparatus for controlling the voltages to word line switches.

FIG. 8 is a block diagram of an embodiment of an apparatus 800 for controlling the voltages to word line switches. In one embodiment, the apparatus 800 resides on control die 211. In one embodiment, the apparatus 800 resides on memory die 201 with the memory structure 202. The WL switches 702 reside in P-well 510. In an embodiment, the p-well 510 resides in a deep N-well 512, but the n-well is not depicted in FIG. 8. Each WL switch is connected to a word line in the memory structure. In an embodiment the WL switches 702 are all of the WL switches for one plane. However, it is not required that all of the WL switches 702 for one plane be in the same p-well.

Transfer circuitry 704 resides in different P-well 810 than the P-well 510 in which the WL switch transistors 702 reside. In an embodiment, P-well 810 resides in an n-well but the n-well is not depicted in FIG. 8. The transfer circuitry 704, negative voltage source 706, and non-negative voltage 708 are similar to those in the apparatus 700 in FIG. 7. Thus, the transfer circuitry 704 may be used to provide voltages to the gates of the WL switch transistors 702 that are associated with unselected blocks.

The negative voltage source 706 is connected to the P+ region 820 in the p-well region 810 in which the transfer circuitry 704 resides in order to provide the negative voltage to the p-well region 810. The negative voltage source 706 is also connected to the input of the transfer circuitry 704 in order to provide the negative voltage to the input of the transfer circuitry 704. An output of the transfer circuitry 704 is connected to the gates of the WL switches 702. Therefore, the transfer circuitry 704 passes the negative voltage to the gates of the WL switches associated with the unselected blocks. Note that the voltage to the gates of the WL switches associated with the selected block is provided by other circuitry (not depicted in FIG. 8).

Switch A 830 is connected between the negative voltage source 706 and the P+ region 520*a* in the p-well region 510 in which the WL switches reside. Switch A 830 is configured to selectively provide the negative voltage to p-well region 510 in which the WL switches reside. Switch A 830 responds to a control signal A to either pass the negative voltage to p-well region 510 or prevent the negative voltage from passing to the p-well region 510.

Switch B 832 is connected between non-negative voltage circuitry 708 and the P+ region 520*b* in the p-well region 510 in which the WL switches 702 reside. Switch B 832 is configured to selectively provide the non-negative voltage to the p-well region 510 in which the WL switches 702 reside. Switch B 832 responds to a control signal B to either pass the non-negative voltage to the p-well region 510 or prevent the non-negative voltage from passing to the p-well region 510.

The control circuit 714 provides the control signals A, B to the switches 830, 832. The control circuit 714 thus controls whether the negative voltage or the non-negative voltage is provided to the p-well region 510 in which the WL switches 702 reside. In an embodiment, the substrate 514 and any n-well (e.g., a deep n-well) below the p-wells 510, 810 are grounded.

FIG. 9 is a block diagram of an embodiment of an apparatus 900 for controlling the voltages to word line switches. In one embodiment, the apparatus 900 resides on control die 211. In one embodiment, the apparatus 900 resides on memory die 201 with the memory structure 202. Apparatus 900 is similar to apparatus 800 in FIG. 8; however, apparatus 900 adds two additional switches 930, 932.

Switch C 930 is connected between the negative voltage source 706 and the P+ region 820*a* in the p-well region 810 in which the transfer circuitry 704 resides. Therefore, switch C 930 selectively passes the negative voltage to the p-well region 810 in which the transfer circuitry 704 resides. Switch C 930 is also connected between the negative voltage source 706 and the input of the transfer circuitry 704. Therefore, switch C 930 selectively passes the negative voltage to the input of the transfer circuitry 704. Switch C 930 responds to a control signal C from the control circuit 714.

Switch D 932 is connected between non-negative voltage circuitry 708 and the P+ region 820*b* in the p-well region 810 in which the transfer circuitry 704 resides. Therefore, switch D 932 selectively passes the non-negative voltage to the p-well region 810 in which the transfer circuitry 704 resides. Switch D 932 is also connected between non-negative voltage circuitry 708 and the input of the transfer circuitry 704. Therefore, switch D 932 selectively passes the non-negative voltage to the input of the transfer circuitry 704. Switch D 932 responds to a control signal D from the control circuit 714.

The control circuit 714 provides the control signals A B, C, D to the switches 930, 932. The control circuit 714 thus controls whether the negative voltage or the non-negative voltage is provided to the p-well region 810 in which the transfer circuitry 704 resides. The control circuit 714 thus controls whether the negative voltage or the non-negative voltage is provided to the input of the transfer circuitry 704. As with the apparatus 800 of FIG. 8, the control circuit 714 provides the control signals to the switches 830, 832. The control circuit 714 thus controls whether the negative voltage or the non-negative voltage is provided to the p-well region 510 in which the WL switches 702 reside. In an embodiment, the substrate 514 and any n-well (e.g., deep n-well) below the p-wells 510, 810 are grounded.

Figure 10:
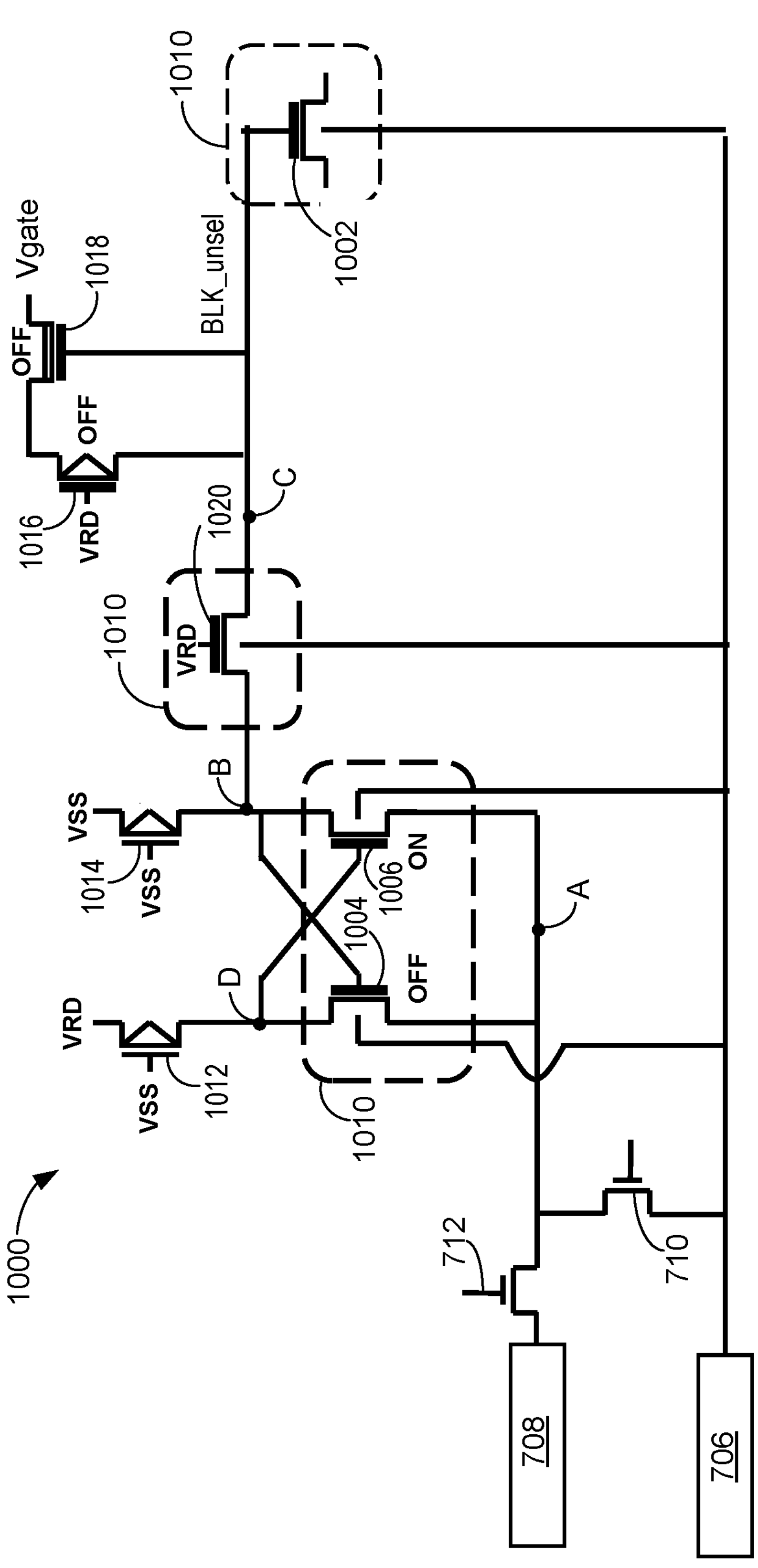
FIG. 10 is a schematic diagram of circuitry for providing voltages to a WL switch transistor that may be used in the apparatus of FIG. 7.

FIG. 10 is a schematic diagram of circuitry 1000 for providing voltages to a WL switch transistor. The circuitry 1000 in FIG. 10 is one embodiment of circuitry that may be used in apparatus 700 in FIG. 7. The circuitry 1000 will primarily be discussed for the case in which the block associated with the WL select transistor 1002 is unselected. The WL switch transistor 1002 resides in a well 1010. In an embodiment, the WL switch transistor 1002 resides in a p-well, which resides in a deep n-well in a substrate. In an embodiment, the WL switch transistor 1002 resides in a n-well, which resides in a deep n-well in a substrate. In an embodiment, "triple well" technology is used. Forming transistors in a triple well is known to those of ordinary skill in the art. The WL switch transistor 1002 is one of many for the unselected blocks. Some of the other transistors 1004, 1006, and 1020 also reside in the same well 1010 as the WL switch transistor 1002.

The negative voltage source 706, non-negative voltage circuitry 708, first switch 710 and second switch 712 are depicted in circuitry 1000. The transfer circuitry 704 (see FIG. 7) may include transistors 1004, 1006, and 1020. Transistors 1004 and 1006 may be referred to herein as a "cross-coupled transistor pair". An input to the transfer circuitry 704 is labeled as node A. An output to the transfer circuitry 704 is labeled as node C. Thus, the input of the transfer circuitry 704 is connected to both switches 710, 712. The output of the transfer circuitry 704 is connected to the gate of the WL switch transistor 1002. Therefore, the cross-coupled transistor pair receives either the negative voltage or the non-negative voltage at Node A and provides the voltage from Node A to Node B. Transistor 1020 transfers the voltage from Node B to Node C to provide the voltage to the gate of the WL switch transistor 1002. Note the negative voltage source 706 is connected to the well 1010. In an embodiment, the negative voltage source 706 is connected to P+ region 520 in P-well 510 (see FIG. 7).

FIG. 10 depicts some of the voltages that are applied to circuit 1000 when the block associated with the WL switch transistor 1002 is unselected. Included are voltage VRD and VSS applied to transistors 1012 and 1014, as depicted in FIG. 10. In an embodiment, the voltage VRD is a positive voltage. As operated as depicted in FIG. 10, transistor 1004 is OFF and transistor 1006 is ON. Transistor 1020 has voltage VRD at its gate to transfer the voltage from node B to node C. The voltage VRD may appear at node D.

Transistors 1016 and 1018 may be used to provide a voltage to the gate of the WL switch transistor 1002 when the block associated with the WL switch transistor 1002 is selected for a memory operation. In other words, transistors 1016 and 1018 may be used to provide the BLK_sel signal to the gate of the WL switch transistor 1002. When the block is selected the voltage Vgate at transistor 1018 may be passed to the gate of the WL select transistor 1002. However, in the operating conditions depicted in FIG. 10, transistors 1016 and 1018 are both OFF. Therefore, Vgate is not passed. Instead, the BLK_unsel signal is provided to the gate of the WL switch transistor 1002 by transistor 1020 in the example in FIG. 10. Note that the magnitude of the BLK_unsel signal may be negative (from negative voltage source 706) or non-negative (from non-negative voltage circuitry 708). In one embodiment, non-negative voltage circuitry 708 provides 0V (which may be referred to as VSS or ground).

Control signals are provided to the gates of the switches 710, 712 to determine which voltage is passed as the BLK_unsel signal. The control circuit 714 may provide the control signals. In an embodiment, the BLK_unsel signal (gate of WL switch transistor 1002) and well voltage is as follows in Table I.

TABLE I

| | Read | Erase | Program |
|---|---|---|---|
| Vgate | Negative | 0 V | 0 V |
| Well | Negative | Negative | Negative |

The magnitude of the negative voltage to the well may be different for read, erase, and program. In some embodiments, the negative voltage to the well 1010 for program and erase is about −0.1 to −0.5V; however, the negative voltage to the well 1010 for program and erase is not limited to this range.

Note that at least some of the circuitry in FIG. 10 may be global circuitry for an entire plane. For example, in an embodiment, only one of each switch 710, 712 is needed for a plane. However, there will be a very large number of WL switch transistors 1002 per plane (only one of which is depicted in FIG. 10). For example, there may be a separate WL switch transistor 1002 for each word line in the plane.

Figure 11:
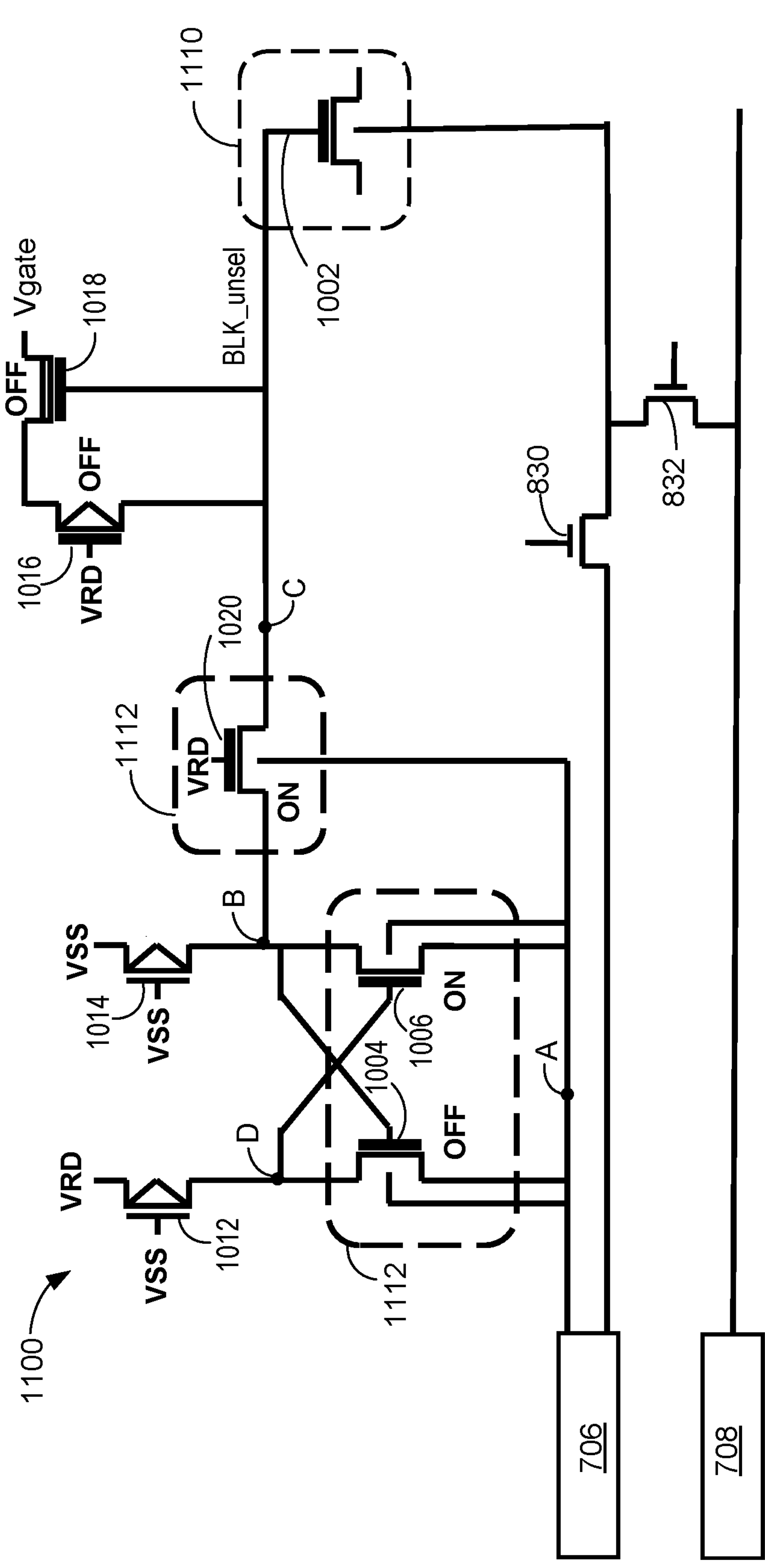
FIG. 11 is a schematic diagram of circuitry for providing voltages to a WL switch transistor that may be used in the apparatus of FIG. 8.

FIG. 11 is a schematic diagram of circuitry 1100 for providing voltages to a WL switch transistor. The circuitry 1100 in FIG. 11 is one embodiment of circuitry that may be used in apparatus 800 in FIG. 8. The circuitry 1100 will primarily be discussed for the case in which the block associated with the WL select transistor is unselected. The circuitry shares some elements in common with the circuitry 1000 in FIG. 10; therefore, such elements will not be described again in detail.

The WL switch transistor 1002 resides in a well 1110. The WL switch transistor 1002 is one of many for the unselected block. Transistors 1004, 1006, and 1020 reside in a different well 1112 than the WL switch transistor 1002. In one embodiment, well 1110 and well 1112 are both p-wells. These two p-wells may be in an n-well. In one embodiment, well 1110 and well 1112 are both n-wells.

The negative voltage source 706, non-negative voltage 708, switch A 830 and switch B 832 are depicted in circuitry 1100. The transfer circuitry 704 (see FIG. 8) may include transistors 1004, 1006, and 1020. The input to the transfer circuitry 704 is labeled as node A and is connected to the negative voltage source. Therefore, the cross-coupled transistor pair receives the negative voltage at Node A and provides the negative voltage from Node A to Node B. Transistor 1020 transfers the negative voltage from Node B to Node C to provide the negative voltage to the gate of the WL switch transistor 1002. The BLK_unsel signal is being provided to the gate of the WL switch transistor 1002 by transistor 1020 in the example in FIG. 11. Note that the magnitude of the BLK_unsel signal is negative (from negative voltage source 706).

Switch A 830 is connected between the negative voltage source and the well 1110 in which the WL switch transistor 1002 resides. Switch B 832 is connected between the non-negative voltage source and the well 1110 in which the WL switch transistor 1002 resides. Control signals are provided to the gates of the switches 830, 832 to determine which voltage is passed as the well 1110. The control circuit 714 may provide the control signals. In an embodiment, the BLK_unsel signal (gate of WL switch transistor 1002) and well 1110 voltage is as follows in Table II.

TABLE II

| | Read | Erase | Program |
|---|---|---|---|
| Vgate | Negative | Negative | Negative |
| WL switch Well | Negative | 0 V | 0 V |

The magnitude of the negative voltage to the gate of WL switch transistor 1002 may be different for read, erase, and program. In some embodiments, the negative voltage to the gate of WL switch transistor 1002 for program and erase may range from about −0.1 to −5V; however, the negative voltage to the gate of WL switch transistor 1002 for program and erase is not limited to this range. Although Table II shows that 0V is provided to the well 1110 for program and erase, a negative voltage from negative voltage source 706 may be provided to the well 1110 for program or for erase. Table III depicts an alternative embodiment in which the voltage to well 1110 is negative for erase.

TABLE III

| | Read | Erase | Program |
|---|---|---|---|
| Vgate | Negative | Negative | Negative |
| WL switch Well | Negative | Negative | 0 V |

Figure 12:
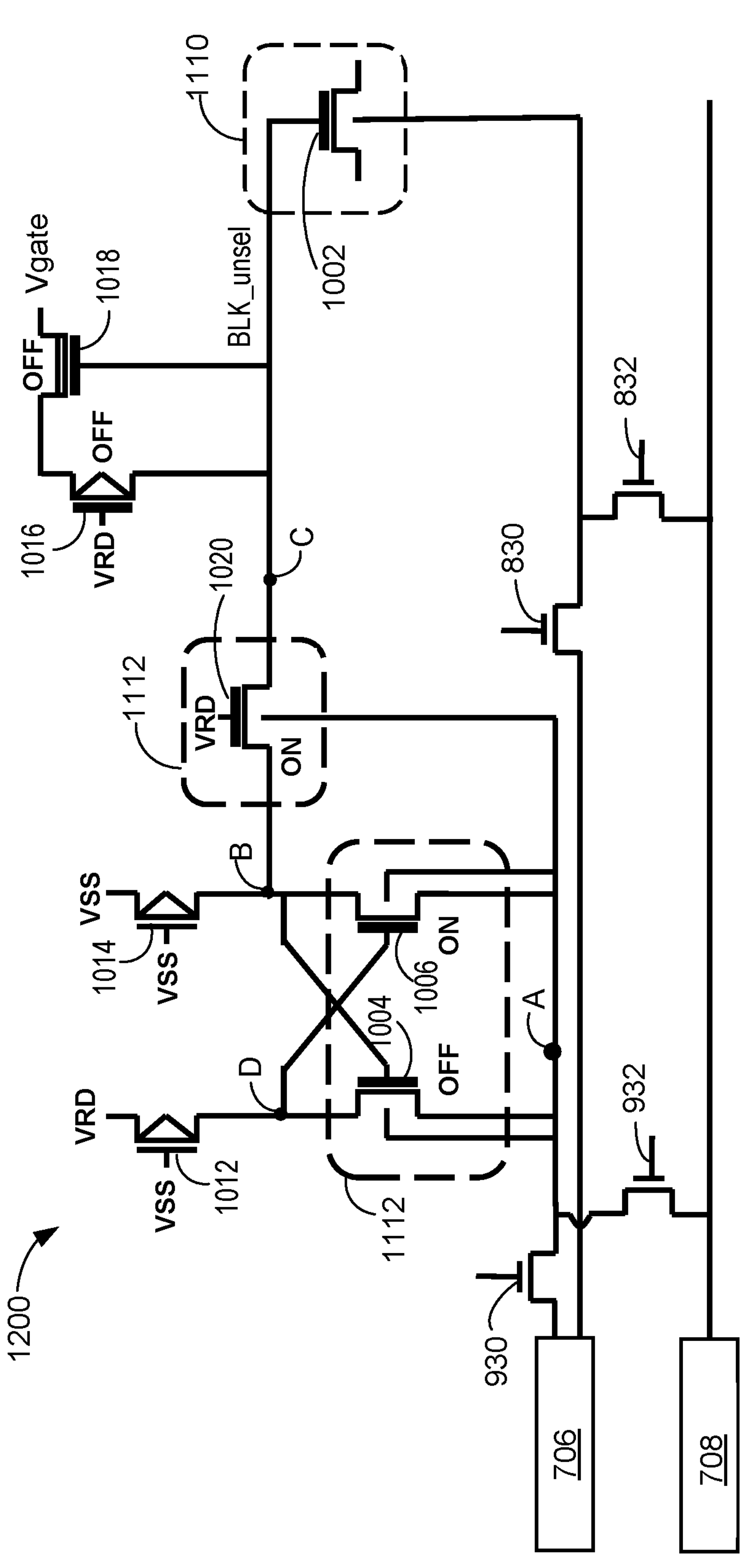
FIG. 12 is a schematic diagram of circuitry for providing voltages to a WL switch transistor that may be used in the apparatus of FIG. 9.

FIG. 12 is a schematic diagram of circuitry 1200 for providing voltages to a WL switch transistor. The circuitry 1200 in FIG. 12 is one embodiment of circuitry that may be used in apparatus 900 in FIG. 9. The circuitry 1200 will primarily be discussed for the case in which the block associated with the WL select transistor is unselected. The circuitry shares some elements in common with the circuitry 1100 in FIG. 11; therefore, such elements will not be described again in detail.

Circuitry 1200 adds two switches 930, 932 relative to circuitry 1100 in FIG. 11. Switch C 930 is connected between the negative voltage source 706 and the well 1112 in which the transfer circuitry resides. Switch C 930 is also connected between the negative voltage source 706 and the input (node A) of the transfer circuitry (e.g., the input of the cross-coupled transistor pair). Switch D 932 is connected between non-negative voltage circuitry 708 and the well 1112 in which the transfer circuitry resides. Switch D 932 is also connected between non-negative voltage circuitry 708 and the input (node A) of the transfer circuitry (e.g., the input of the cross-coupled transistor pair). The control circuit 714 provides control signals (voltages) to the gates of the switches 930, 932 to selectively control whether the negative voltage or the non-negative voltage is passed to the well 1112 and to the input of the transfer circuitry. The BLK_unsel signal (gate of WL switch transistor 1002) and well 1110 voltage is as follows in Table IV.

TABLE IV

| | Read | Erase | Program |
|---|---|---|---|
| Vgate | Negative | 0 V | Negative |
| WL Switch Well | Negative | Negative | 0 V |

The magnitude of the negative voltage to the gate of WL switch transistor 1002 may be different for read and program. In some embodiment, the negative voltage to the gate of WL switch transistor 1002 for program ranges from about −0.1 to −5V; however, the negative voltage to the gate of WL switch transistor 1002 for program is not limited to this range. The magnitude of the negative voltage to the WL switch well 1110 may be different for read and erase. In some embodiments, the negative voltage to the WL switch well 1110 for erase ranges from about −0.1 to −0.5V; however, the negative voltage to the WL switch well 1110 for erase is not limited to this range.

Note that the circuitry 1200 is not limited to the example provided in Table IV. The circuitry 1200 could be used to provide any combination of negative and non-negative voltage to the WL switch well 1110 and the gate of the WL switch transistor 1002.

One embodiment includes an apparatus comprising a substrate, a well residing in the substrate, a word line switch transistor residing in the well, and circuitry residing in the well. The word line switch transistor is configured to provide a voltage to a word line in a memory structure when a block having the word line is selected. The word line switch transistor having a control gate. The circuitry comprises a plurality of transistors. The circuitry has an input. The circuitry has an output coupled to the gate of the word line switch transistor. The apparatus comprises a first switch configured to receive a negative voltage and to selectively pass the negative voltage to the input of the circuitry. The apparatus comprises a second switch configured to receive a non-negative voltage and to selectively pass the non-negative voltage to the input of the circuitry. The apparatus comprises a control circuit in communication with the circuitry, the first switch, and the second switch. The control circuit is configured to operate the first switch, the second switch and the circuitry when the block is not selected for a memory operation to provide a negative voltage from the first switch to the well while providing a non-negative voltage from the second switch to the gate of the word line switch transistor via the circuitry.

In a further embodiment, the memory operation is a program operation.

In a further embodiment, the memory operation is an erase operation.

In a further embodiment, the memory operation is a read operation.

In a further embodiment, the negative voltage is a first negative voltage and the control circuit is further configured to operate the first switch, the second switch and the circuitry when the block is not selected for a read operation to provide a second negative voltage from the first switch to the gate of the word line switch transistor via the circuitry while providing the second negative voltage from the first switch to the well.

In a further embodiment, the well comprises a p-well further comprising an n-well in the substrate, wherein the p-well resides within the n-well.

In a further embodiment, the well comprises a first n-well, further comprising a second n-well in the substrate, wherein the first n-well resides within the second n-well.

In a further embodiment, the non-negative voltage is a ground voltage.

In a further embodiment, the plurality of transistors comprise a cross-coupled pair of transistors. The cross-coupled pair has a first transistor and a second transistor having cross-coupled gates. The first transistor and the second transistor reside in the well. The first transistor and the second transistor each have a source connected to the first switch and to the second switch.

In a further embodiment, the apparatus comprises a first semiconductor die comprising the word line switch transistor, the circuitry, the first switch, the second switch, and the control circuit. The apparatus comprises a second semiconductor die comprising the memory structure.

An embodiment includes a method for operating word line switch transistors. The method comprises selecting a block in a memory structure for a first memory operation, including providing a first positive block select voltage to gates of first word line switch transistors in a well in a substrate. The method comprises unselecting a plurality of blocks in the memory structure while selecting the block for the first memory operation, including: operating switches to provide a first non-negative block unselect voltage to gates of second word line switch transistors in the well while providing a first negative voltage to the well. The method comprises selecting the block for a second memory operation, including providing a second positive block select voltage to the gates of the first word line switch transistors. The method comprises unselecting the plurality of blocks while selecting the block for the second memory operation, including: operating the switches to provide a second negative block unselect voltage to the gates of the second word line switch transistors in the well while providing a third negative voltage to the well.

An embodiment includes a memory system having a memory structure having blocks. Each block has word lines. The memory system has a substrate; a first p-well residing in a first region of the substrate; a second p-well residing in a second region of the substrate separated from the first region of the substrate; and a word line switch transistor residing in the second p-well. The word line switch transistor is configured to provide a voltage to a word line in particular block when the particular block is selected. The word line switch transistor has a control gate. The memory system has circuitry comprising a plurality of transistors residing in the first p-well. The circuitry has an input and an output coupled to the control gate of the word line switch transistor. The memory system has a negative voltage source configured to output a negative voltage and non-negative voltage circuitry configured to output a non-negative voltage. The memory system has a first switch connected between the negative voltage source and the second p-well. The first switch is configured to receive the negative voltage from the negative voltage source and to selectively pass on the negative voltage to the second p-well. The memory system has a second switch connected between the non-negative voltage circuitry and the second p-well. The second switch is configured to receive the non-negative voltage from the non-negative voltage circuitry and to selectively pass on the negative voltage to the second p-well. The memory system has a control circuit configured to operate the negative voltage source, the circuitry, the first switch and the second switch when the particular block is not selected for a memory operation to provide different magnitude voltages to the control gate of the word line switch transistor via the circuitry and to the second p-well.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

a substrate;

a deep well;

a second well residing in the deep well in the substrate;

a word line switch transistor residing in the second well, the word line switch transistor configured to provide a voltage to a word line in a memory structure when a block having the word line is selected, the word line switch transistor having a gate;

a first switch configured to receive a negative voltage and to selectively pass the negative voltage;

second switch configured to receive a non-negative voltage and to selectively pass the non-negative voltage;

circuitry residing in the second well, wherein the circuitry comprises a plurality of transistors, the circuitry having an input, the circuitry having an output coupled to the gate of the word line switch transistor, wherein the plurality of transistors comprise a cross-coupled pair of transistors, the cross-coupled pair having a first transistor and a second transistor having cross-coupled gates, the first transistor and the second transistor reside in the well, the first transistor having a first source connected to the first switch and to the second switch, the second transistor having a second source connected to the first switch and to the second switch, the first source and the second source being the input of the circuitry;

the first switch configured to selectively pass the negative voltage to the input of the circuitry;

the second switch configured to selectively pass the non-negative voltage to the input of the circuitry; and a control circuit in communication with the circuitry, the first switch, and the second switch, the control circuit configured to:

operate the first switch, the second switch and the circuitry when the block is an unselected block that is not selected for a memory operation to provide a negative voltage to the second well while selectively providing either a negative voltage from the first switch via the circuitry to the gate of the word line switch transistor for the unselected block as a negative block unselect signal or a non-negative voltage from the second switch via the circuitry to the gate of the word line switch transistor for the unselected block as a non-negative block unselect signal.

2. The apparatus of claim 1, wherein the memory operation is a program operation and the control circuit operates the first switch to prevent the negative voltage from passing to the gate of the word line switch transistor via the circuitry and operates the second switch to provide the non-negative voltage to the gate of the word line switch transistor via the circuitry as the non-negative block unselect signal.

3. The apparatus of claim 1, wherein the memory operation is an erase operation and the control circuit operates the first switch to prevent the negative voltage from passing to the gate of the word line switch transistor via the circuitry and operates the second switch to provide the non-negative voltage to the gate of the word line switch transistor via the circuitry as the non-negative block unselect signal.

4. The apparatus of claim 1, wherein the memory operation is a read operation and the control circuit operates the first switch to provide the negative voltage to the gate of the word line switch transistor via the circuitry as the negative block unselect signal and operates the second switch to prevent the non-negative voltage from passing to the gate of the word line switch transistor via the circuitry.

5. The apparatus of claim 1, wherein the second well comprises a p-well, the deep well is an n-well in the substrate.

6. The apparatus of claim 1, wherein the second well comprises a first n-well, the deep well is a second n-well in the substrate.

7. The apparatus of claim 1, wherein the non-negative voltage is a ground voltage.

8. A method for operating word line switch transistors, the method comprising:

selecting a block in a memory structure for a first memory operation, including providing a first positive block select voltage to gates of first word line switch transistors in a well in a substrate, the first memory operation being either a program operation or an erase operation;

unselecting a plurality of blocks in the memory structure while selecting the block for the first memory operation, including:

operating switches to provide a first non-negative block unselect voltage to gates of second word line switch transistors in the well while providing a first negative voltage to the well;

selecting the block for a second memory operation, including providing a second positive block select voltage to the gates of the first word line switch transistors, the second memory operation being a read operation; and unselecting the plurality of blocks while selecting the block for the second memory operation, including:

operating the switches to provide a second negative block unselect voltage to the gates of the second word line switch transistors in the well while providing a third negative voltage to the well.

9. The method of claim 8, wherein:

the first memory operation is a program operation.

10. The method of claim 8, wherein:

the first memory operation is an erase operation.

11. A memory system, comprising:

a memory structure having blocks, each block having word lines;

a substrate;

a first p-well residing in a first region of the substrate;

a second p-well residing in a second region of the substrate separated from the first region of the substrate;

a word line switch transistor residing in the second p-well, the word line switch transistor configured to provide a voltage to a word line in a particular block when the particular block is selected, the word line switch transistor having a control gate;

circuitry comprising a plurality of transistors residing in the first p-well, the circuitry having an input, the circuitry having an output coupled to the control gate of the word line switch transistor;

a negative voltage source configured to output a negative voltage, wherein the negative voltage source is connected to the first p-well to provide the negative voltage to the first p-well, the negative voltage source is connected to the input of the circuitry to provide the negative voltage to the circuitry;

non-negative voltage circuitry configured to output a non-negative voltage;

a first switch connected between the negative voltage source and the second p-well, the first switch configured to receive the negative voltage from the negative voltage source and to selectively pass on the negative voltage to the second p-well;

a second switch connected between the non-negative voltage circuitry and the second p-well, the second switch configured to receive the non-negative voltage from the non-negative voltage circuitry and to selectively pass on the negative voltage to the second p-well; and a control circuit configured to operate the negative voltage source, the circuitry, the first switch and the second switch when the particular block is not selected for a memory operation to provide different magnitude voltages to the control gate of the word line switch transistor via the circuitry and to the second p-well, the control circuit is configured to operate the first switch and the second switch when the particular block is not selected for the memory operation to provide the non-negative voltage from the non-negative voltage circuitry to the second p-well while the negative voltage source provides the negative voltage to the control gate of the word line switch transistor via the circuitry.

12. The memory system of claim 11, further comprising:

a third switch connected between the negative voltage source and the input of the circuitry, the third switch connected between the negative voltage source and the first p-well, the third switch configured to receive the negative voltage from the negative voltage source and to selectively provide the negative voltage to the input of the circuitry and to the first p-well; and a fourth switch connected between the non-negative voltage circuitry and the input of the circuitry, the fourth switch connected between the non-negative voltage circuitry and the first p-well, the fourth switch configured to receive the non-negative voltage from the non-negative voltage circuitry and to selectively provide the non-negative voltage to the input of the circuitry and to the first p-well.

13. The memory system of claim 12, wherein the control circuit is configured to operate the first switch, the second switch, the third switch, and the fourth switch when the particular block is not selected for the memory operation to provide the non-negative voltage from the non-negative voltage circuitry to the second p-well while the negative voltage source provides the negative voltage to the control gate of the word line switch transistor via the circuitry.

14. The memory system of claim 12, wherein the control circuit is configured to operate the first switch, the second switch, the third switch, and the fourth switch when the particular block is not selected for the memory operation to provide the negative voltage from the negative voltage source to the second p-well while the non-negative voltage circuitry provides the non-negative voltage to the control gate of the word line switch transistor via the circuitry.

15. A memory system, comprising:

a memory structure having blocks, each block having word lines;

a substrate;

a first p-well residing in a first region of the substrate;

a second p-well residing in a second region of the substrate separated from the first region of the substrate;

a word line switch transistor residing in the second p-well, the word line switch transistor configured to provide a voltage to a word line in particular block when the particular block is selected, the word line switch transistor having a control gate;

circuitry comprising a plurality of transistors residing in the first p-well, the circuitry having an input, the circuitry having an output coupled to the control gate of the word line switch transistor;

a negative voltage source configured to output a negative voltage, wherein the negative voltage source is connected to the first p-well to provide the negative voltage to the first p-well, the negative voltage source is connected to the input of the circuitry to provide the negative voltage to the circuitry;

non-negative voltage circuitry configured to output a non-negative voltage;

a first switch connected between the negative voltage source and the second p-well, the first switch configured to receive the negative voltage from the negative voltage source and to selectively pass on the negative voltage to the second p-well;

a second switch connected between the non-negative voltage circuitry and the second p-well, the second switch configured to receive the non-negative voltage from the non-negative voltage circuitry and to selectively pass on the negative voltage to the second p-well; and a control circuit configured to operate the negative voltage source, the circuitry, the first switch and the second switch when the particular block is not selected for a memory operation to provide different magnitude voltages to the control gate of the word line switch transistor via the circuitry and to the second p-well, wherein the control circuit is configured to operate the first switch and the second switch when the particular block is not selected for the memory operation to provide the negative voltage from the negative voltage source to the second p-well while the negative voltage source provides the negative voltage to the control gate of the word line switch transistor via the circuitry.

16. The memory system of claim 15, wherein the memory operation is an erase operation.

* * * * *